(12) United States Patent
Andle et al.

(10) Patent No.: US 7,569,971 B2
(45) Date of Patent: Aug. 4, 2009

(54) COMPENSATION OF RESONATORS FOR SUBSTRATE AND TRANSDUCER ASYMMETRY

(75) Inventors: Jeffrey C Andle, Falmouth, ME (US); Bert W. A. Wall, Potsdam (DE)

(73) Assignee: Delaware Capital Formation, Inc., Wilmington, DE (US)

( * ) Notice: Subject to any disclaimer, the term of this patent is extended or adjusted under 35 U.S.C. 154(b) by 149 days.

(21) Appl. No.: 11/865,829

(22) Filed: Oct. 2, 2007

(65) Prior Publication Data

US 2009/0085430 A1    Apr. 2, 2009

(51) Int. Cl.
*H01L 41/04* (2006.01)

(52) U.S. Cl. .................................. 310/313 D

(58) Field of Classification Search ............. 310/313 B, 310/313 R, 313 D; 333/193–196
See application file for complete search history.

(56) References Cited

U.S. PATENT DOCUMENTS

| | | | |
|---|---|---|---|
| 3,716,809 A | 2/1973 | Reeder et al. | |
| 3,961,293 A | 6/1976 | Hartmann et al. | |
| 4,144,507 A | 3/1979 | Shreve | |
| 4,387,355 A | 6/1983 | Uno et al. | |
| 4,616,197 A | 10/1986 | Wright | |
| 4,731,595 A * | 3/1988 | Wright | 333/195 |
| 5,294,859 A * | 3/1994 | Yamanouchi et al. | 310/313 D |
| 5,895,996 A | 4/1999 | Takagi et al. | |
| 6,420,946 B1 | 7/2002 | Bauer et al. | |
| 6,762,534 B2 * | 7/2004 | Martin et al. | 333/193 |
| 6,865,950 B2 | 3/2005 | Freakes et al. | |
| 7,089,794 B2 | 8/2006 | Kalinin et al. | |
| 2004/0020299 A1 | 2/2004 | Freakes et al. | |

FOREIGN PATENT DOCUMENTS

| | | |
|---|---|---|
| GB | 2 381 069 A | 4/2003 |
| GB | 2 386 684 A | 9/2003 |
| WO | 02/099968 A1 | 12/2002 |
| WO | 2004/082137 A3 | 9/2004 |

OTHER PUBLICATIONS

Plessky et al., "Coupling-Of-Modes Analysis of SAW Devices", International Journal of High Speed Electronics and Systems, 2000, pp. 1-81, World Scientific Publishing Company.

(Continued)

*Primary Examiner*—Quyen Leung
*Assistant Examiner*—Karen B Addison
(74) *Attorney, Agent, or Firm*—Vern Maine & Associates

(57) ABSTRACT

An in-line SAW resonator employs an asymmetric adjustment of the Bragg frequencies of the left outer reflector and right outer reflector where the degree of periodicity shift and the relative direction of the frequency shift are calculated to move the peaks of the acoustic standing wave trapped between the gratings to coincide with the optimized centers of transduction of one or more interdigital transducers (IDTs) without the need for undesirable breaks in the periodicity or the use of reflectionless IDTs.

20 Claims, 17 Drawing Sheets

OTHER PUBLICATIONS

Williams et al., "Numerical Analysis of Doubly Rotated Cut Saw Devices", IEEE Ultrasonics Symposium, 1979, pp. 627-631.

Lardat et al., "Micro-machined, All Quartz Package, Passive Wireless SAW Pressure and Temperature Sensor", IEEE Ultrasonics Symposium, 2006, pp. 1441-1444.

Avramov, Ivan D., "High Q Metal Strip SSBW Resonators Using a SAW Design", IEEE Transactions on Ultrasonics, Nov. 1990, pp. 530-534, vol. 37, No. 6.

Vetelino, J.F. et al., "Theory, Design and Operation of Surface Generated Acoustic Wave Sensors", IEEE, 1994, pp. 505-508.

* cited by examiner

COMPENSATION OF RESONATORS FOR SUBSTRATE AND TRANSDUCER ASYMMETRY

FIELD OF THE INVENTION

The invention relates to sensors, and more particularly, to dispersive acoustic sensing technology.

BACKGROUND OF THE INVENTION

Acoustic wave devices have been used extensively in the art as frequency reference resonators, delay lines, and sensors. The oldest acoustic wave device structure is the parallel plate resonator, which consists of a plate of piezoelectric material having substantially flat and parallel polished surfaces, one or both of which support one or more conducting electrodes. When a voltage signal is applied between the electrodes, stress fields induce elastic deformations of the crystal (strain fields). The deformations of the crystal alter the distribution of charge within the crystal and a net flow of charge (a current) exists. Resonance occurs when the mirror-polished crystal faces are spaced in multiples of a half wavelength, modified for the effects of electrodes and surface contouring.

A more advanced acoustic wave device utilizes surface acoustic waves, surface transverse waves, or acoustic plate modes, collectively known as surface generated acoustic wave (SGAW) devices. This term was defined by John Vetelino (see for example, *Theory, design and operation of surface generated acoustic wave sensors*, Vetelino et al, Microwave Symposium Digest, 1994., IEEE MTT-S International, 23-27 May 1994 Page(s):505-508 vol. 1) to mean any acoustic wave that is generated at, detected at, and interacts with the surface of the piezoelectric. It includes SAW (SH and Rayleigh), leaky SAW, Love, Lamb, acoustic plate mode, shallow bulk acoustic wave, surface skimming bulk wave, and the like. Briefly, these devices comprise, by way of non-limiting examples, a substrate of piezoelectric material such as quartz, or thin films of piezoelectric material, such as zinc oxide, on a non-piezoelectric substrate. The substrate has at least one active piezoelectric surface area, which is highly polished. Formed on the surface are input and optional output transducers for the purpose of converting input electrical energy to acoustic energy within the substrate and reconverting the acoustic energy to an electric output signal. The input and output transducers frequently comprise interdigital transducers each comprising a plurality of interdigital electrode fingers which are electrically coupled to an input signal, and to an output measurement device respectively. Such transducers are known as IDT (interdigital transducer) and are typically formed by depositing a thin film of electrically conductive material such as aluminum or gold in the desired shape on the active area or by chemically modifying an insulating or semiconducting medium. Electrical potential is coupled to the input transducer and induces mechanical stresses and strains in the piezoelectric substrate. The resultant acoustic waves propagate along the surface of the substrate to the optional output transducer or are reflected back to said input transducer, whereby they are converted to output electrical signals. The waves may propagate along the surface of the crystal (surface modes), or within the bulk of the crystal structure (waveguide modes).

When designing an acoustic wave device, one has to consider the size, number, mass, shape, and connection method of the electrodes, as those parameters significantly affect the behavior of the device. The effects of the electrode design are known in the art and a continuum of properties is well observed in the literature, especially with regards to metal type and thickness. For simplicity, an electrode structure is mechanically insignificant where an acoustic wave traveling under a short-circuited transducer containing mechanically insignificant electrodes would experience no significant reflective coupling into a reverse-traveling wave due to the periodic perturbations from the nominal surface conditions outside the transducer region.

The opposite of mechanically insignificant electrode structure described above, is naturally the mechanically significant electrode structure, meaning that such reflective coupling would be created and enhanced. Generally speaking mechanically significant electrodes are employed to reflect or contain acoustic energy. An arrangement of one or more mechanically significant electrodes can be employed to implement a reflective member of an acoustic wave device, as would be required in a resonator.

The invention relates specifically to acoustic wave resonators based on SGAW. The most commonly used SGAW for resonator structures are surface acoustic wave (SAW) and surface transverse wave (STW); however any SGAW is a candidate and is understood to be considered herein.

Fundamentally a resonator requires two outer reflective elements having reflection, $\Gamma_i$, separated by a transmission element having transmission, $T_{ij}$. Transmission term $T_{12}$ defines the magnitude and phase shift of the signal at reflector 1 due to a signal incident from reflector 2 and vice versa. The resonant frequencies of this generalized structure are the zeros of $$1-\Gamma_1 T_{12} T_{21} \Gamma_2$$

and requires the magnitudes of $\Gamma_i$ and $T_{ij}$ to all be unity (loss-free) for zeros to occur on the real frequency axis. Practical resonators have finite loss and the zeros lie in the complex plane with a damping term. Minimizing that loss, and therefore the quality factor (Q) of the acoustic resonance, is a designer's high priority.

An acoustic wave resonator may be generically defined as two reflective members separated by a transmission member arranged such that the sum of the phases of the two reflection coefficients and the double transit phase of the intervening transmission member is a multiple of $2\pi$ at a desired frequency, namely the so-called resonant frequency. The phase condition mathematically states that the successive echoes within the structure are in phase, creating a standing wave of stored energy. When applied to the mirror surfaces of a polished crystal, this condition yields the well known half-wavelength thick bulk wave resonator. This simplistic view of a resonator neglects the step of injecting and sampling acoustic stored energy by an electrical circuit for the SGAW case.

The polished mirror surface of the bulk wave resonator is impractical in SGAW devices and instead a pseudo-periodic array of reflective elements is employed. The subject matter herein is independent of the myriad means by which reflective elements have been implemented in the past; however the two most common means are etched grooves and metal strips. Dot arrays (etched or metal) have also been demonstrated.

Where specific definitions are needed, a "reflective element" refers to a single feature (etched groove or metal strip, etc.) and a "reflector array" or "reflector" or "grating" refers to an ensemble of said reflective elements. By far the most common implementation is a periodic reflector array having several hundred individual reflective elements with a periodicity that is nominally half that of the intended acoustic wavelength. The most common reflective elements are metal strips with a width of one quarter of the acoustic wavelength and a thickness on the order of 1.5% of the acoustic wavelength. These details are offered by way of illustration and the literature offers many examples of thinner and thicker metal, shallower or deeper grooves, and wider or narrower features. While the most common arrangements employ uniformly periodic reflection, one skilled in the art will realize that there are advantages relative to sidelobe suppression and reduction of bulk wave scattering that may be realized by slightly modulating the periodicity. Therefore a reflector array shall be taken to include a pseudo-periodic array of reflective elements. It is noted that for structures of modulated periodicity, there is a nominal constant periodicity of an idealized periodic structure that will provide the same behavior near the frequencies of interest. This nominal periodicity is a weighted average periodicity and shall be implied to be the "periodicity" describing the structure.

The salient property of a reflective element and of a reflector array is that they remove energy from a traveling acoustic wave and scatter it back into a wave of identical frequency traveling in the opposite direction. One well known effect of asymmetry is that the direction of the phase velocity vector and energy velocity vector are not coincident. The angle between these vectors is known as the power flow angle and it has been long understood that the centerline of the array should nominally follow the energy velocity vector since energy will flow along this vector. In contrast, the individual elements naturally remain perpendicular to the phase velocity vector such that the wave phase is constant across the electrode or reflector. The existence of a power flow angle requires one to further clarify that the reflected signal has energy reflected back along the incident energy velocity vector (centerline of the array) with equal and opposite angle between said centerline and the associated phase velocity. This solution to power flow angle is illustrated in Cho and Williams' FIGS. 13 and 14 in "Numerical Analysis of Doubly Rotated Cut SAW Devices", Williams and Cho, 1979 IEEE Ultrasonics Symposium. It has long been recognized that such power flow angle compensation is applicable to resonators and impedance elements as well as to delay lines. One sufficiently skilled in the art will recognize that one can equally well slant the electrodes, keeping the energy velocity vector "horizontal" or stagger the electrodes vertically, making the energy velocity vector slant.

A more important property of substrate asymmetry is that the peaks of acoustic energy are displaced from the peaks of electric energy, resulting in a so-called phase shift between the centers of transduction and the centers of reflection in an IDT having mechanically significant electrodes. In the least case this asymmetry incurs increased spurious modes and in the worst case, incurs seriously reduced piezoelectric coupling to the resonator's standing wave. The aim of the present invention is to address this issue. The remaining background material explains the resonator structure and how the asymmetry affects the resonator properties.

The aggregate effect of a large number of periodically spaced reflective elements is to prevent an acoustic wave from traveling unimpeded through the array at a frequency for which the wavelength of the acoustic wave is nearly equal to twice the periodicity of the array. At this so-called Bragg frequency, the reflections from each element in the array are coherent with one another and the wave is completely reflected (in the absence of undesired dissipative losses). Due to the interaction of the incident and reflected waves on each other, this synchronicity is maintained over a band of frequencies near the synchronous or Bragg frequency. The width of the band is determined by the strength of the reflective coupling of the individual elements and is known as the stopband.

The reflection coefficient of an array of electrodes beginning at X=0 and continuing on indefinitely is ideally unity across the stopband and rapidly falls to zero outside the stopband. For a finite number of elements the reflection within the stopband is not unity and the transition region is finite with many sidelobes.

The phase of the reflectivity depends on the reference plane. It is assumed herein that the reference plane is located lambda/4 from the center of the first element and that the array consists of lambda/4 metal strips. This reference plane is chosen so that a reflective array appears to have the same reflection phase from its right and left faces on a symmetric substrate orientation and so that the centers of transduction are located at points of high symmetry (center of gaps or center of electrodes). In this case there is an odd multiple of 90° (π/2 radians) of reflection phase (of the dominant acoustic component) at the Bragg frequency as seen in prior art FIG. 1. Slight numerical error and non-ideal properties inherent in the model lower the Bragg frequency slightly below the simple estimate of $F_B$=V/2P for velocity, V, and period, P. Two other frequencies within the stopband are seen to also exhibit an odd multiple of 90°, one near the lower stopband edge and one near the upper stopband edge.

The required spacing of an intervening transmission medium to obtain an acoustic resonance and standing wave at the Bragg frequency is (N+0.25)P, where P is the wavelength of the acoustic wave at the synchronous frequency. A trivial case having no transducer is indicated in prior art FIG. 2. The associated resonance at synchronous frequency (~500 MHz) would be accompanied by spurious resonances (~499 MHz and ~501 MHz) and potentially near other quadrature points coinciding with reflector sidelobes. The exact locations of such spurious resonances will depend on N, among other factors.

Increasing the spacing would alter the round-trip transmission phase from −180° to a more negative number and subsequently require a less negative reflection phase. This would result a lower resonant frequency, also reducing the phase increase of the longer transmission medium. Shortening the transmission medium would have the opposite effect. One skilled in the art can model such structures and analyze the interaction of the non-linear system of equations governing the resonance condition.

Propagation loss in the transmission member and reflection losses from the finite reflector array determine the quality of the resonator in its unloaded state. The unloaded quality factor, $Q_U$, is mathematically defined as the stored energy of the resonator in said standing wave divided by the energy lost per cycle. High quality resonances require very low reflection losses and very low transmission losses.

An acoustic wave resonator is only practical if one is capable of exchanging energy with an electrical circuit, requiring either the transmission member or one or both of the reflection members to also provide a transducer means. The electrical load presented by said electrical circuit represents a loss mechanism to the acoustic stored energy that reduces the effective quality factor. The so-called loaded quality factor, $Q_L$, is dependent on the load impedance and is lower than $Q_U$ for all cases other than open and short circuit conditions.

The transducer means consists of a collection of at least one so-called cell having interdigitated electrodes. In the simplest case each cell is identical and periodic at the transducer period, having a single positive and a single negative electrode. However there are numerous transducer cells known in the art, having lengths equal to the period as well as to harmonics and sub-harmonics of the period. There are also transducers consisting of cells having different lengths, arranged in an ensemble with an average period. Each cell has a physical center, a center of reflection, and a center of transduction. The relative locations of the centers of transduction and reflection within a cell are related to each other by a combination of cell design and substrate properties.

On symmetric orientations a cell having symmetry or antisymmetry will have a relative phase between transduction and reflection equal to a multiple of a quarter period (90°). Since a translation of the center of transduction by a quarter period can be accomplished by changing the polarity of the assumed reflection coefficient, any multiple of a quarter wavelength may be considered a symmetric arrangement of the centers of transduction and reflection. Asymmetry, as occurs for intentionally asymmetric cells or for symmetric cells on asymmetric orientations of piezoelectric media, alters the design requirements and electrical performance of the resulting acoustic wave device. The present invention discusses methods of compensating device performance for the consequences of having such asymmetric cells, in which the centers of transduction and centers of reflection are displaced from the high symmetry conditions, denoted herein as an asymmetry between its centers of transduction and its centers of reflection.

The earliest SAW devices sought to apply finite impulse response (FIR) filter theory to a simple delay line structure consisting of an input transducer and an output transducer. The structures diligently avoided reflections and taught toward the use of mechanically insignificant electrode structures. Delay lines and finite impulse response filters were found to require electrical mismatching in order to suppress undesired time domain echoes. Means were sought to overcome this electrical inefficiency and, for narrow-band applications, resonator filters were developed.

It is therefore no surprise that the earliest SAW resonators were implemented by placing arrays of mechanically significant electrodes as reflector arrays on either side of such reflectionless IDTs as in U.S. Pat. No. 3,716,809. The resulting devices were found to have numerous resonant frequencies due to the long acoustic length of the transmission member between the reflective members U.S. Pat. No. 3,961,293.

Shreve U.S. Pat. No. 4,144,507 overcame this problem of spurious modes by incorporating the transduction means directly into the reflective member. The most significant of the remaining spurious modes were addressed by selective placement of transducer nulls by Wright U.S. Pat. No. 4,616,197. However, both Shreve and Wright relied on a finite break in the periodicity of the structure. Such breaks are known to result in energy scattering into the bulk of the substrate and are generally considered undesirable.

Prior art FIG. 3 illustrates a generic one port resonator in which the interdigital transducer 301 is located between reflector arrays 302 and 303. In general, there may also be finite phase shift regions 304 and 305. Also generally speaking, the periods of the IDT (P1) need not be equal to the equal periods of the two reflectors (P2=P3); however all of the periods are nearly equal to each other and to half the acoustic wavelength at or near the resonant frequency.

Prior art FIG. 4A illustrates a situation in which the transmission element is simply an interdigital transducer without phase skips. At the synchronous (Bragg) frequency of the structure, $F_B$, the transducer has an acoustic phase shift equal to a multiple of $2\pi$; however the reflectivity of each of the end reflectors is $\pi/2$ at this frequency if P1=P2=P3 as is typical of the prior art. The structure of prior art FIG. 4A will not satisfy the resonant conditions at the center frequency if the periods are all equal. If one examines the frequency dependence of the grating, one sees that the reflection magnitude is essentially constant over a band of frequencies known as the stopband. These are the frequencies for which the forward and reverse traveling waves are reflectively coupled into each other and the width of this band is determined by the reflectivity per wavelength of the grating structure, $\kappa$. Between the stopband edge frequencies, $F_B(1\pm\kappa/2\pi)$, there is typically a range of reflection phase from at least $-\pi$ to $\pi$. The structure illustrated in prior art FIG. 4A typically exhibits a resonance closer to the stopband edges when the period is constant throughout the structure.

Avramov (I. D. Avramov, "High Q metal strip SSBW resonators using a SAW design", IEEE Trans. UFFC., vol. 37, pp. 530-534, 1990), has used this structure to maximize dispersive energy trapping in STW resonators. One drawback to this approach for frequency control applications is in the manufacturing yield. The resonant frequency of the device is dependent on $F_B$ and on $\kappa$. Both of these parameters vary with metal thickness and line-to-space ratio. The further the resonant frequency is removed from $F_B$ the worse this variability is.

In the early days of resonator manufacture, the photolithographic process was near its limitations and it was necessary to operate the resonator at $F_B$ to maximize yield in cost-sensitive, high volume applications as discussed in "Coupling-Of-Modes Analysis Of Saw Devices", V. Plessky, International Journal of High Speed Electronics and Systems. In order to accomplish this while maintaining a synchronous structure (a structure in which the local period within each element is constant other than in one or more discrete steps and in which reflectivity of the IDT was in phase with that of at least one neighboring reflector) it is necessary to insert an additional $\pi/2$ of transmission phase, requiring an excess P/4 of transmission line. The requisite phase could be implemented in phase shift region 304 or 305 or through a combination of the two. If IDT 301 of prior art FIG. 3 is selected to be reflectionless, then the only relevance of the relative lengths of phase shifters 304 and 305 is the synchronization of the standing wave between the reflectors with the transduction centers of the IDT. In the case wherein the IDT is reflective, there will exist second order interactions of the reflectivity of the IDT and the actual reflectors; however the primary constraint will continue to be maximizing electrical efficiency.

The IDT 401 in prior art FIG. 4B is placed synchronous with the left reflector 402. The left phase shift 404 is zero and the right phase shift 405 is $\pi/2$. This additional phase shift defines a cavity feature to which the wave is trapped and the stored energy decreases with distance from the cavity. It should be noted that the sinusoidal signal is meant to convey the acoustic wave's associated electrical potential. It is therefore noted that at the resonant frequency, $F_B$, the transducer is no longer located in the ideal phase relationship to the stored energy, resulting in decreased electrical performance. Furthermore there exists increased electrical efficiency at frequencies below the desired resonance, resulting in a spurious resonance below the desired frequency. Finally, there exists a null at a frequency slightly above resonance where the standing wave is located exactly $\pi/2$ away from the transducer's optimum sampling locations. In addition to the resonant condition established above, it is therefore beneficial that the transducers be located in the transmission element in such a way that the centers of transduction of the transducer align more or less synchronous with the peaks of the standing wave of stored energy in the resonator.

Prior art FIG. 4C shows a two-port resonator wherein each IDT is synchronous with the adjacent reflector. Interconnecting the transducers results in the composite transducer of U.S. Pat. No. 4,616,197. The use of a short, frequency-shifted grating with an effective length of (M+0.25) to alleviate the bulk wave scattering of the finite gap is known in the art. This so-called hiccup transducer places the cavity in the middle of the transducer. This adds a second null due to the array factor at the peak of coupling of the individual electrodes and allows the resonance to be at the Bragg frequency. One-port resonators sold by R F Monolithics in the mid 1980's e.g., the ROxxxx family part numbers employed the structure of prior art FIG. 4C in which the $\pi/2$ shift was implemented as six "periods" of "reflector array" with their period decreased by 5.75/6. The effect was to implement the requisite phase shift with no break in local structure and only a modest discontinuity in the periodicity of the reflectors. Other arrangements are well known in the art and certain embodiments are disclosed by Bauer in U.S. Pat. No. 6,420,946.

As an alternative to Wright, the electrical performance of a resonator can be improved by inserting less than the full $\pi/2$ of phase shift, bringing the resonance below the Bragg frequency and coincident with the peak of electrical coupling. The improvement in electrical performance is obtained at the expense of manufacturing frequency tolerance; however modern lithography allows good yield.

Regardless of the exact length, the skip in periodicity creates a discontinuity that results in conversion of SAW energy into bulk wave energy. Another approach is to slightly alter the period of the transducer as disclosed by Uno in U.S. Pat. No. 4,387,355. Such a resonator employs the fact that mechanically significant electrodes within the transducer distort its electrical response and create a peak of electromechanical coupling related to either the lower or upper edge of the reflective stopband. By placing the coupling resonance of the IDT at the intended resonant frequency of the structure, optimization occurs. Lowering the transducer period raises the frequency at which the electrodes are optimally converting energy and alters the phase shift through the transducer. The structure resonates at a frequency which is not necessarily the synchronous (Bragg) frequency of either the IDT or the reflectors. The prior art approach is illustrated in FIG. 5. IDT 501 has period P1 less than the equal periods, P2=P3, of reflectors 502 and 503.

The aforementioned resonator structures were all implemented on piezoelectric substrates of high symmetry with the exception of U.S. Pat. No. 4,731,595, to Wright. Such substrates have a well defined relationship between the phase of reflection and phase of transduction as being an integral multiple of $\pi/2$. On substrates of significant asymmetry this phase relationship can have any value and for many of the prior art structures disclosed above this results in a need to shift the location of at least one transducer to account for this phase shift, as in Wright, U.S. Pat. No. 4,731,595. Prior art FIG. 3 of Wright illustrates the effect of a $\pi/4$ phase shift between the acoustic standing wave (solid) and associated acoustic potential (dotted) in a synchronous resonator as would result from U.S. Pat. No. 4,144,507 or U.S. Pat. No. 4,616,197, resulting in a null of the electrical coupling at the desired resonant frequency (FIG. 4 of U.S. Pat. No. 4,731,595).

The structure of U.S. Pat. No. 4,731,595 offers a potential solution that has been employed commercially; however the structure has several limitations. One problem is the discrete physical break in periodicity that is known to result in energy scattering into the bulk of the crystal. While this effect is dramatically more severe in surface transverse wave (STW) resonators, it is also a significant limitation to $Q_U$ in SAW resonators. A more significant problem is that the IDT has its peak electromechanical coupling efficiency at the upper and lower edges of the stopband, resulting in substantial coupling to two spurious modes, as predicted above, and a relative decrease of the electrical efficiency of the structure at its resonant frequency. A similar effect occurs in the structure of U.S. Pat. No. 4,387,355; however the decrease of electrical efficiency is less complete.

SUMMARY OF THE INVENTION

The accompanying disclosure outlines device structures and methods of design for same to implement one-port, two-port, and in-line coupled resonators. The present invention according to one embodiment relates to sensing technology based on responses to sensing materials and structures.

A proposed solution is based on a modification of the resonator in FIG. 5. Modern photolithography is substantially more precise and the ability to print lines of differing periodicity with excellent reproducibility offers avenues that have traditionally been taught away from. The design approach for the proposed solution requires the designer to FIRST consider the transducer and then to design the reflectors to accommodate the transducer. An IDT length and width are selected to yield the required conductance. Said selections may be determined by a combination of experience and iterative design. The metal thickness, line-to-space ratio and periodicity are selected to accommodate manufacturing constraints and, optionally, to provide optimum electrical efficiency at the desired resonant frequency.

It is instructive to consider the effects of asymmetry on the conductance of an IDT. FIG. 6 shows the IDT input conductance with $\kappa = -0.015$ and a 45° asymmetry angle (fully NSPUDT) for transducer lengths of 79.5P1 601, 99.5P1 602, and 119.5P1 603. The frequencies of the peaks of conductance are seen to be relatively independent of transducer length. The degree of conductance increase is seen to be significantly dependent on length.

FIG. 7 shows the IDT input conductance with $\kappa = -0.015$ and a transducer length of 99.5P1 with 0° 701, 15° 702, 30° 703, and 45° 704 asymmetry angles. The frequencies of the peaks of conductance are seen to be relatively independent of degree of asymmetry. Again, the degree of conductance peaking is seen to be strongly dependent on asymmetry and the most symmetric orientations have the strongest conductance peak.

FIG. 8 shows the IDT input conductance with a transducer length of 99.5P1 and 45° asymmetry angle for $\kappa = -0.01$ 801, $-0.015$ 802 and $-0.02$ 803. The frequencies of the peaks of conductance are seen to be dependent of the degree of reflective coupling. Therefore the amount by which the IDT period should be adjusted to bring the desired conductance peak into the reflector stopband will depend on the magnitude of the reflectivity but not substantially on the IDT length or the substrate asymmetry.

One embodiment of the invention includes an acoustic wave device comprising a substrate comprising at least a piezoelectric layer, a first reflector disposed on the substrate, having a first reflector Bragg frequency, a second reflector disposed on the substrate, having a second reflector Bragg frequency, and at least one transducer disposed between the first and second reflectors wherein at least one transducer has a plurality of repeating cells, each cell having a center of transduction and a center of reflection, at least one of said cells having an asymmetry between its center of transduction and its center of reflection, the first reflector Bragg frequency and the second reflector Bragg frequency being unequal and providing an adjustment of a standing wave into alignment with the repeating cells' centers of transduction.

In another embodiment of the acoustic wave device above, the substrate induces an asymmetry between the centers of transduction and reflection.

Other embodiments may include the acoustic wave device above, in which the adjustment reduces root mean square (RMS) error of the phase mismatch between centers of transduction and the peaks of the electrical potential of the standing wave, reduces the electrical coupling to spurious modes, or reduces insertion loss.

Yet other embodiments may include the acoustic wave device above, in which at least one of the reflectors comprises dots, strips, edges, grooves, or implanted dopants.

In further embodiments, the acoustic wave device above may include a first transducer and a second transducer for the at least one transducer stated.

In yet a further embodiment, the acoustic wave device above may include a first transducer; a second transducer; and an electrically inactive segment between the first transducer and second transducers for the at least one transducer stated.

In yet another embodiment of the acoustic wave device above, the substrate includes a piezoelectric layer selected from the group consisting of zinc oxide, aluminum nitride, gallium nitride, quartz; gallium phosphate; aluminum phosphate; lanthanum gallium silicate (LGS); lanthanum gallium tantalate (LGT); lanthanum gallium niobate (LGN); calcium niobium gallium silicate (CNGS); calcium tantalum gallium silicate (CTGS); strontium niobium gallium silicate (SNGS); strontium tantalum gallium silicate (STGS), lithium niobate, lithium tantalate and combinations thereof.

An embodiment includes an acoustic wave device comprising an asymmetric substrate comprising at least a piezoelectric layer, a first reflector disposed on the asymmetric substrate, having a first reflector Bragg frequency, a second reflector disposed on the asymmetric substrate, having a second reflector Bragg frequency; and at least one transducer disposed between the first and second reflectors wherein at least one transducer has a plurality of repeating cells, each cell having a center of transduction and a center of reflection, at least one of the cells having an asymmetry between its center of transduction and its center of reflection, the first reflector Bragg frequency and the second reflector Bragg frequency being unequal and providing an alignment of a standing wave into alignment with the repeating cells' centers of transduction.

In another embodiment, the asymmetric substrate acoustic wave device above may include a first transducer and a second transducer for the at least one transducer stated.

In a further embodiment, the asymmetric acoustic wave device above may include a first transducer; a second transducer, and an inactive segment between the first transducer and second transducers for the at least one transducer stated.

In an embodiment of the asymmetric acoustic wave device above, the adjustment reduces the electrical coupling to spurious modes or reduces insertion loss.

In another embodiment of the asymmetric acoustic wave device above, at least one of the reflectors comprises strips.

One additional embodiment is an acoustic wave device comprising an asymmetric substrate comprising at least a piezoelectric layer, a transducer disposed on the asymmetric substrate, a first reflector comprised of strips that is disposed on the asymmetric substrate proximate the side of the transducer, having a first reflector Bragg frequency. This embodiment also including a second reflector comprised of strips, disposed on the asymmetric substrate proximate the side of the transducer that is opposite the first reflector, and having a second reflector Bragg frequency wherein the transducer has a plurality of repeating cells, each cell having a center of transduction and a center of reflection. Furthermore, at least one of the cells having an asymmetry between its center of transduction and its center of reflection, the first reflector Bragg frequency and the second reflector Bragg frequency being unequal and providing an adjustment of a standing wave into alignment with the repeating cells' centers of transduction, wherein the adjustment reduces the electrical coupling to spurious modes.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

A full understanding of the invention can be gained from the following description when read with the accompanying drawings wherein.

Prior art

Prior art

Prior art

Prior art

Prior art

Prior art

Prior art

Prior art

Prior art

Prior art

Prior art

DETAILED DESCRIPTION

Figure 1:
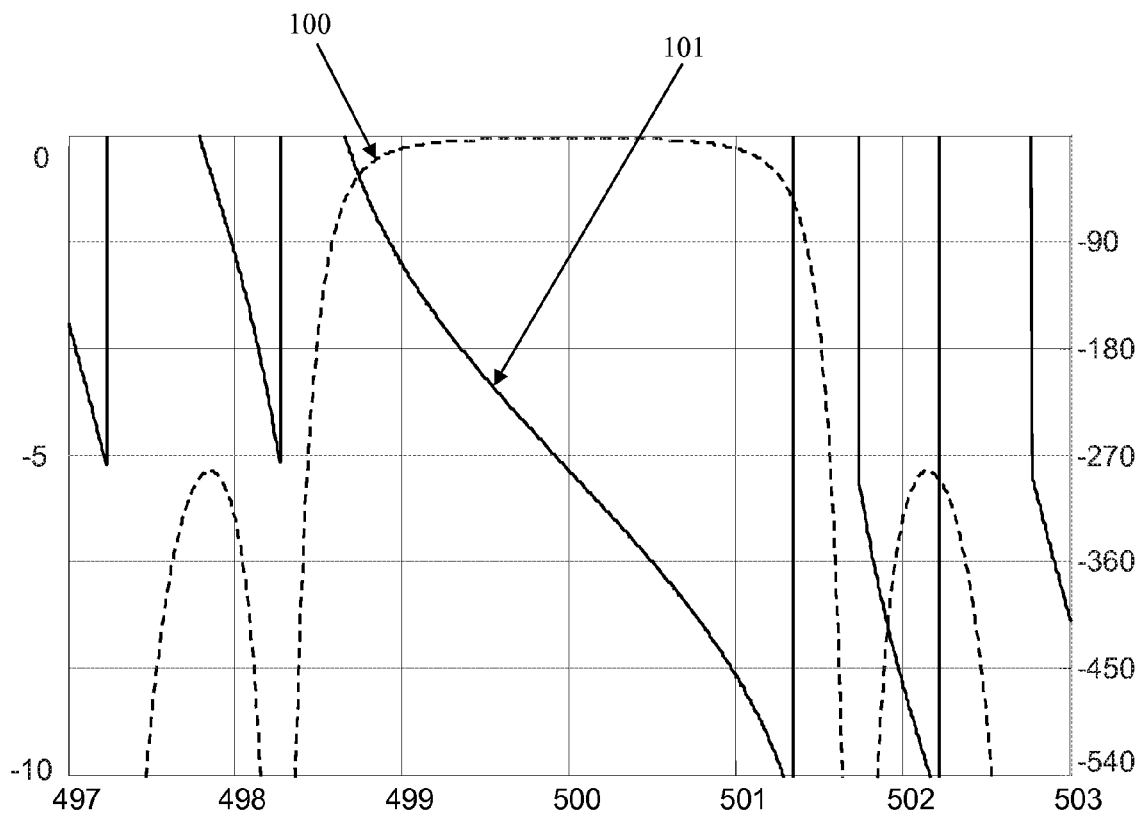
FIG. 1 is a graph of the idealized reflection coefficient, left axis and phase, right axis, for a 200 wavelength long, two-reflector-per-wavelength array.

FIG. 1 shows the idealized prior art reflection coefficient 100 with a scale of dB magnitude, left axis, and phase 101 displayed in degrees, right axis, for a 200 wavelength long, two-reflector-per-wavelength array having a reflective strength of $\kappa=-0.015$ per wavelength. The stopband width is $\pm\kappa_o/2\pi=\pm1.19$ MHz for the illustrated 500 MHz $F_o$.

Figure 2:
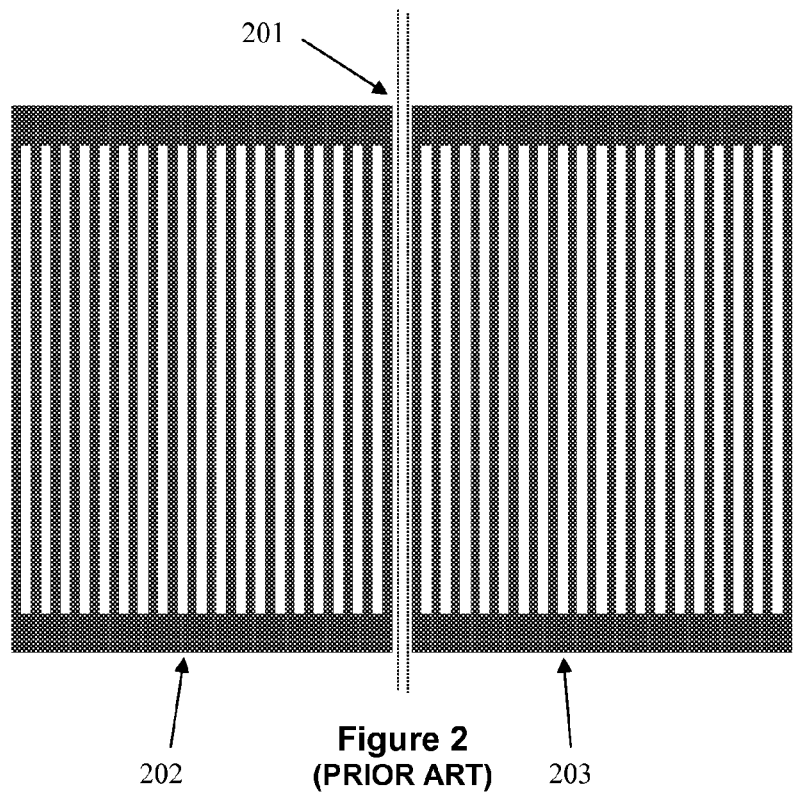
FIG. 2 is a diagram of two identical reflectors with an excess P/4 transmission medium between the reference planes.

FIG. 2 illustrates two identical reflectors 202 and 203, with an excess P/4 transmission medium 201 between the reference planes.

Figure 3:
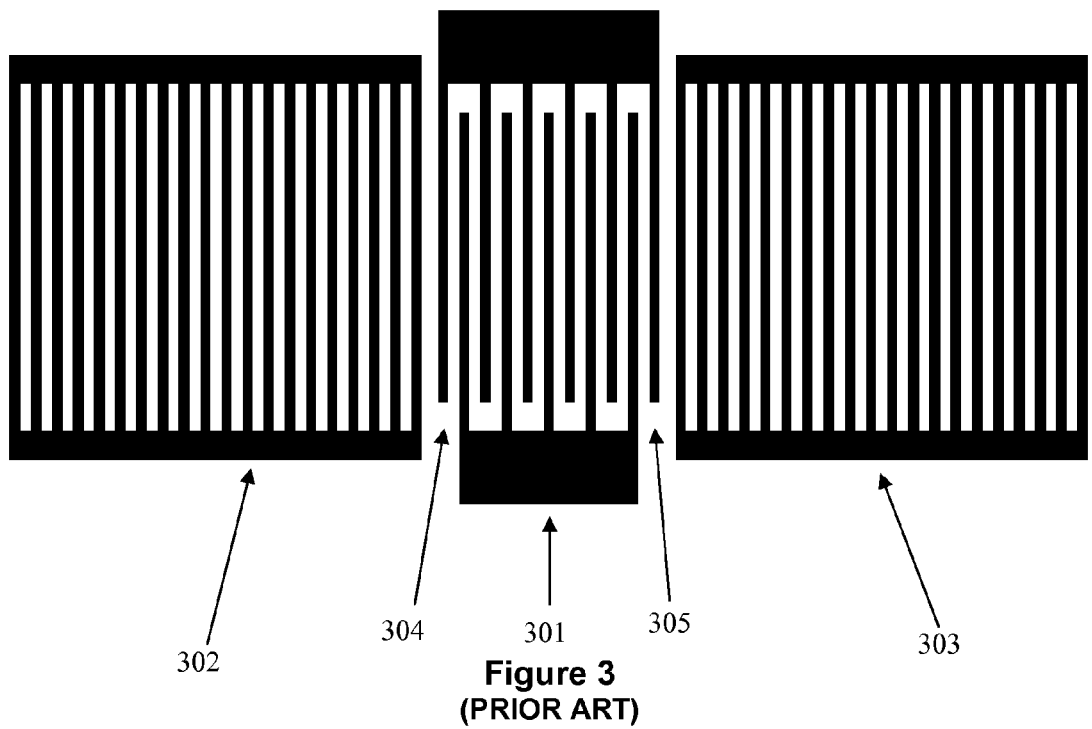
FIG. 3 is a diagram of a one port resonator using constant periodicity with phase breaks.

FIG. 3 is a Prior Art One Port Resonator using constant periodicity with phase breaks 304 and 305. An interdigital transducer IDT 301 of period, P1, is located between two reflective element arrays 302 and 303, having periods, P2 and P3. In this prior art resonator, P1=P2=P3. While the period is continuous, there are discrete breaks of the structure that result in bulk wave scattering.

Figure 4A:
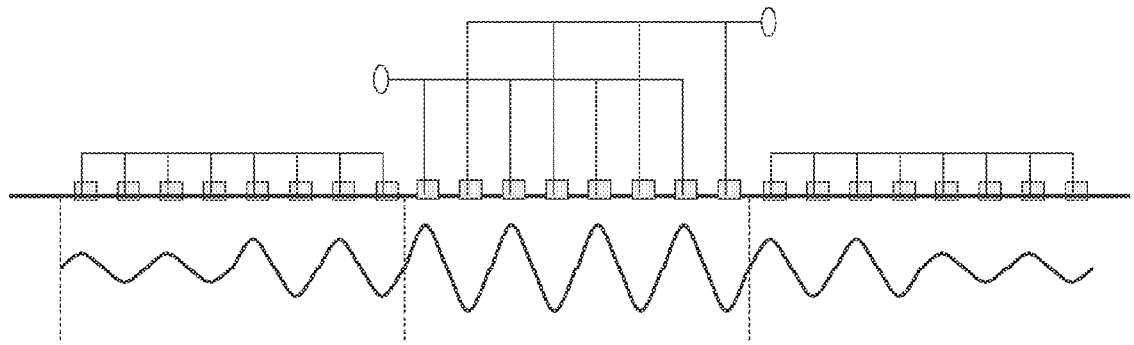
FIG. 4A is a diagram of a periodic and symmetric synchronous structure having a constant period throughout with no phase skips.

FIG. 4A is a prior art periodic and symmetric synchronous structure having a constant period throughout with no phase skips. Such a resonator will not operate at the synchronous frequency but requires a deviation from the Bragg frequency to obtain the requisite phase balance.

Figure 4B:
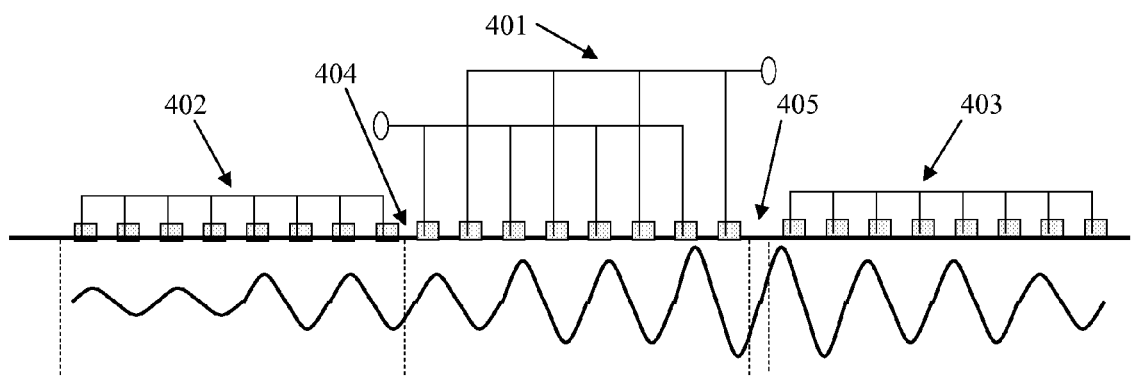
FIG. 4B is a diagram of a synchronous one port resonator.

FIG. 4B is a synchronous one port resonator from the prior art. The IDT 401 is placed synchronous with the left reflector 402. The left phase shift 404 is zero and the right phase shift 405 with the right reflector 403 is $\pi/2$.

Figure 4C:
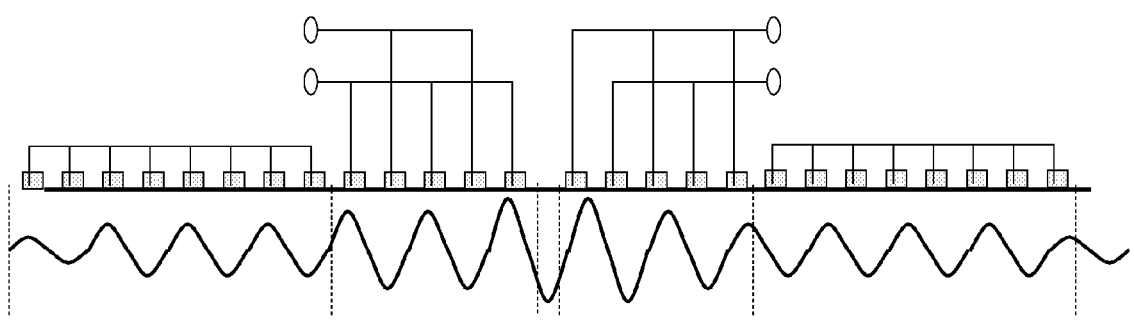
FIG. 4C is a diagram of a synchronous two port resonator.

FIG. 4C is a synchronous two port resonator from the prior art. Connecting bottom left to top right and top left to bottom right yields a hiccup one-port resonator.

Figure 5:
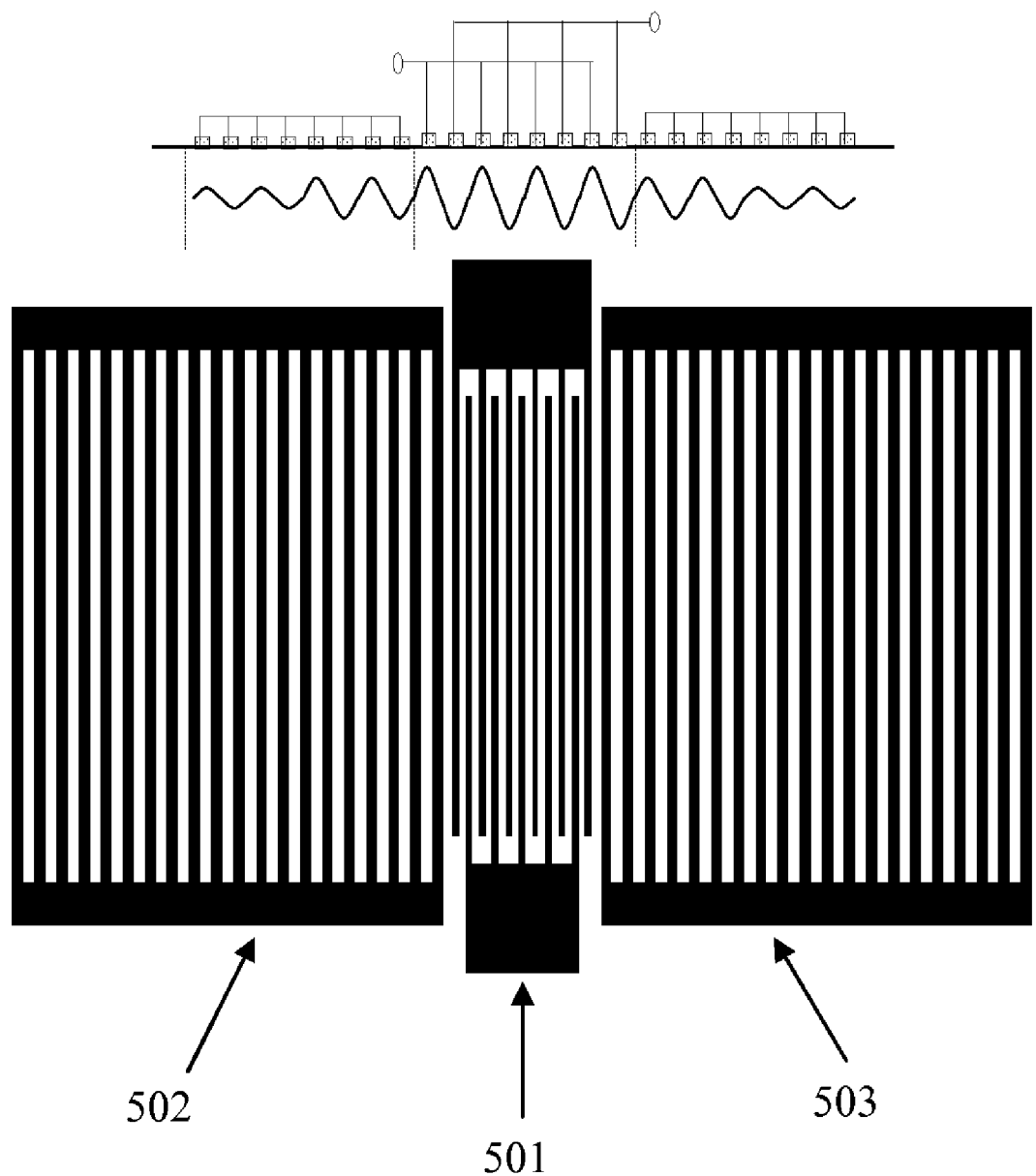
FIG. 5 is a diagram of a one port resonator with altered IDT period and no phase skips where the two reflective element arrays have equal periods.

FIG. 5 is a prior art one port resonator with altered IDT period and no phase skips. An IDT 501 of period, P1, is located between two reflective element arrays 502 and 503 having periods, P2 and P3. In the prior art P2=P3. While the period varies, the arrangement is continuous.

Figure 6:
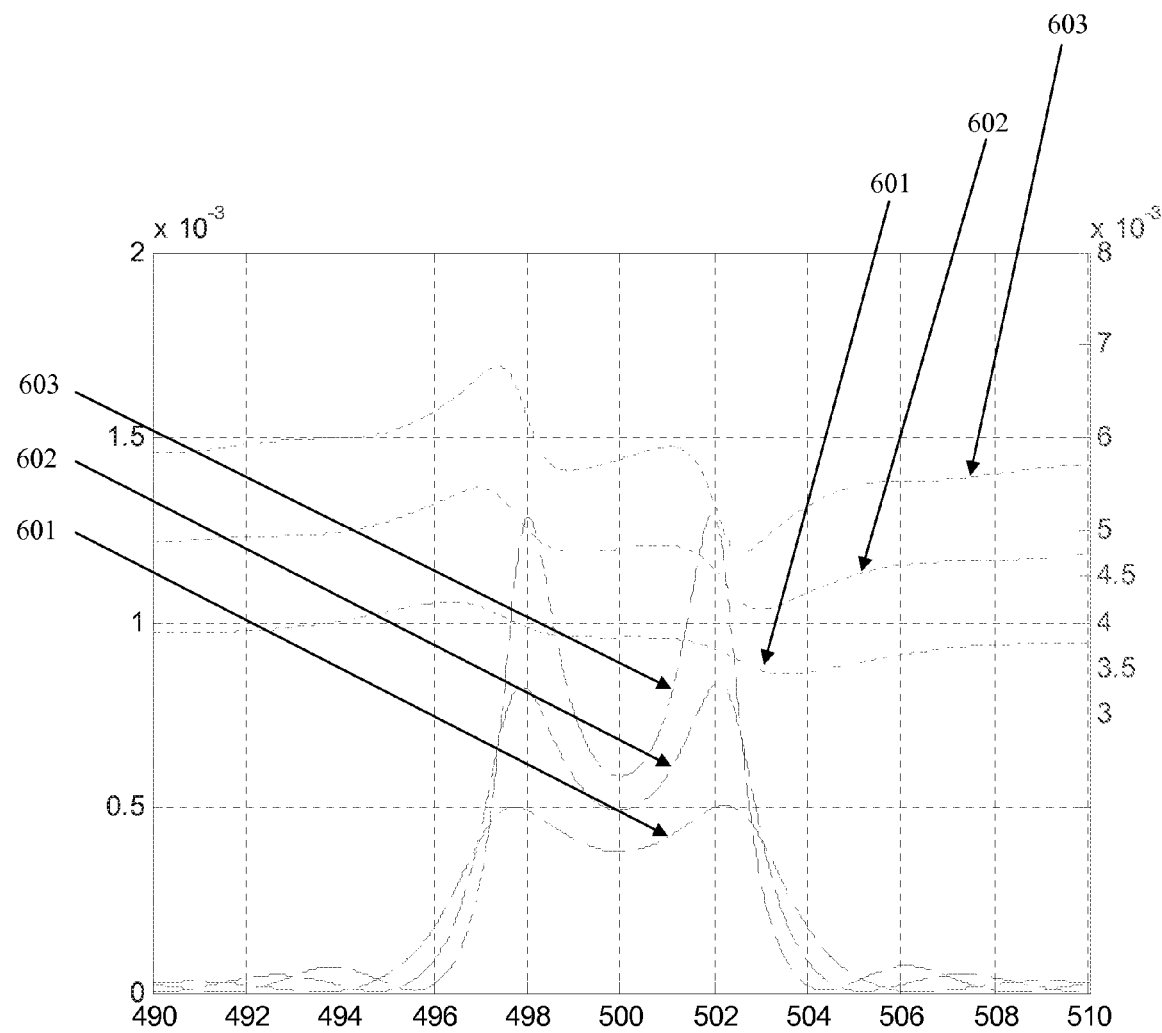
FIG. 6 is a graph of the calculated IDT input conductance for a natural single phase unidirectional transducer (NSPUDT) with varied transducer lengths.

FIG. 6 is the calculated IDT input conductance with $\kappa=-0.015$ and a 45° asymmetry angle for a natural single phase unidirectional transducer (NSPUDT) for transducer lengths of 79.5P1 601, 99.5P1 602, and 119.5P1 603. The frequencies of the peaks of conductance are seen to be relatively independent of transducer length.

Figure 7:
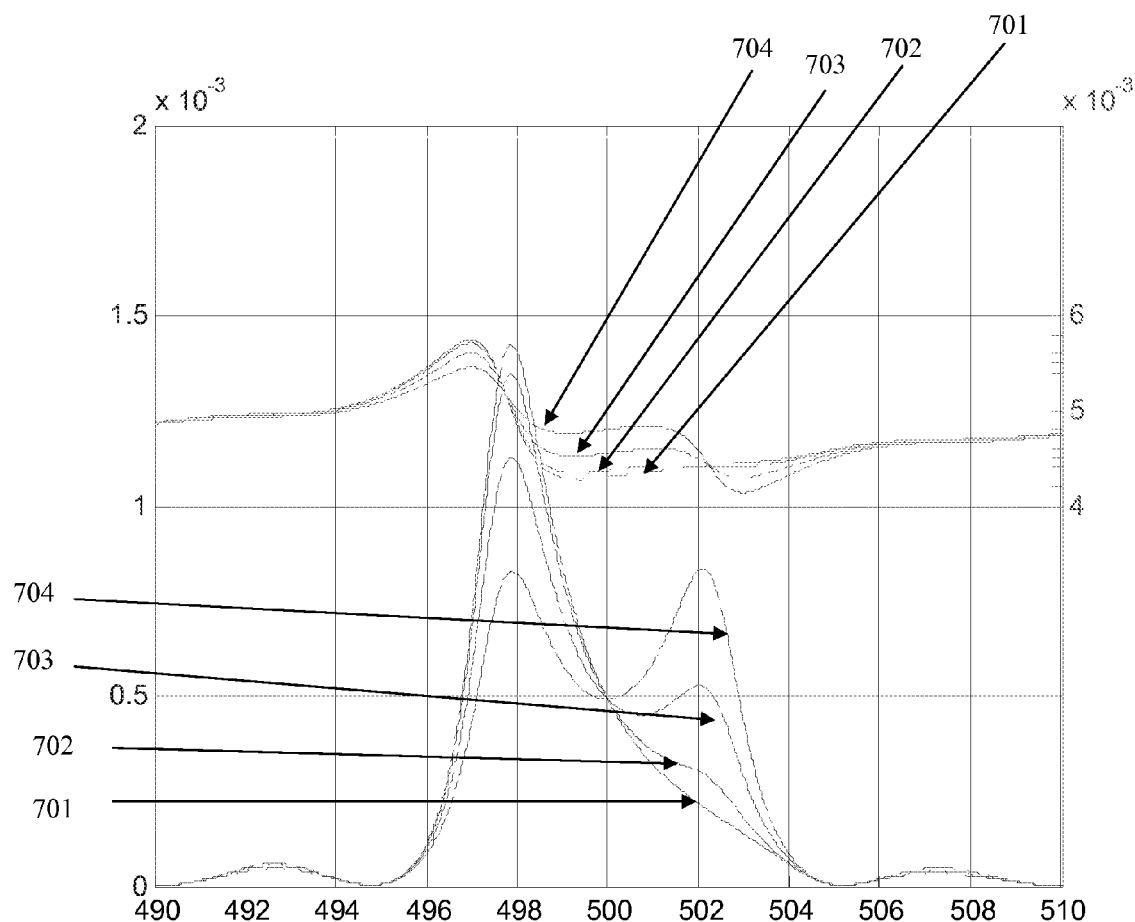
FIG. 7 is a graph of the calculated IDT input conductance with varied asymmetry angles.

FIG. 7 is the calculated IDT input conductance with $\kappa=-0.015$ and a transducer length of 99.5P1 with 0° 701, 15° 702, 30° 703, and 45° 704 asymmetry angles. The frequencies of the peaks of conductance are seen to be relatively independent of degree of asymmetry.

Figure 8:
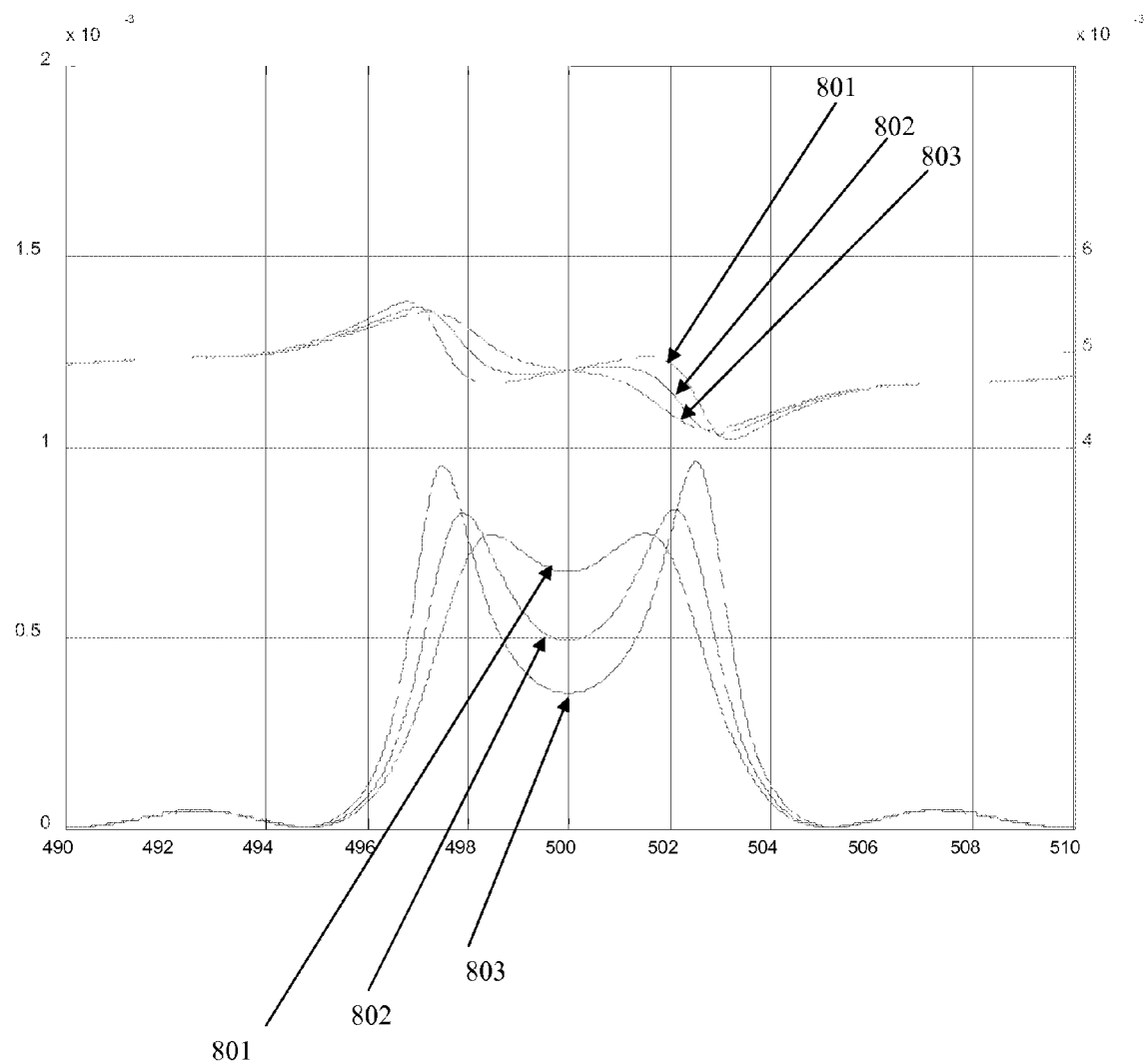
FIG. 8 is a graph of the calculated IDT input conductance with the reflectivity per wavelength of the grating structure, κ, varied.

FIG. 8 is the calculated IDT input conductance with a transducer length of 99.5P1 and 45° asymmetry angle for $\kappa=-0.01$ 801, -0.015 802 and -0.02 803. The frequencies of the peaks of conductance are seen to be dependent of the degree of reflective coupling. Following from FIG. 8, reflectivity of -0.015 per wavelength is typical of aluminum reflectors on quartz SAW resonators. It has historically offered a good compromise between the various loss mechanisms and device size constraints. The following illustrative examples will utilize this design value; however it should not be considered to be limiting.

Reflectors are placed contiguous to each side of the IDT and are initially assumed to have periodicity such that the resonant condition is met for the structure of prior art FIG. 5. Defining Po as the grating period satisfying the Bragg condition, $v_{grating}=F_oP_o$, all other periods may be defined relative to Po. A ratio of P1/Po of 0.9957 and a transducer length of 99.5*P1 suffice to place the resonance at the Bragg frequency of the reflector arrays for this value of reflectivity.

Figure 9:
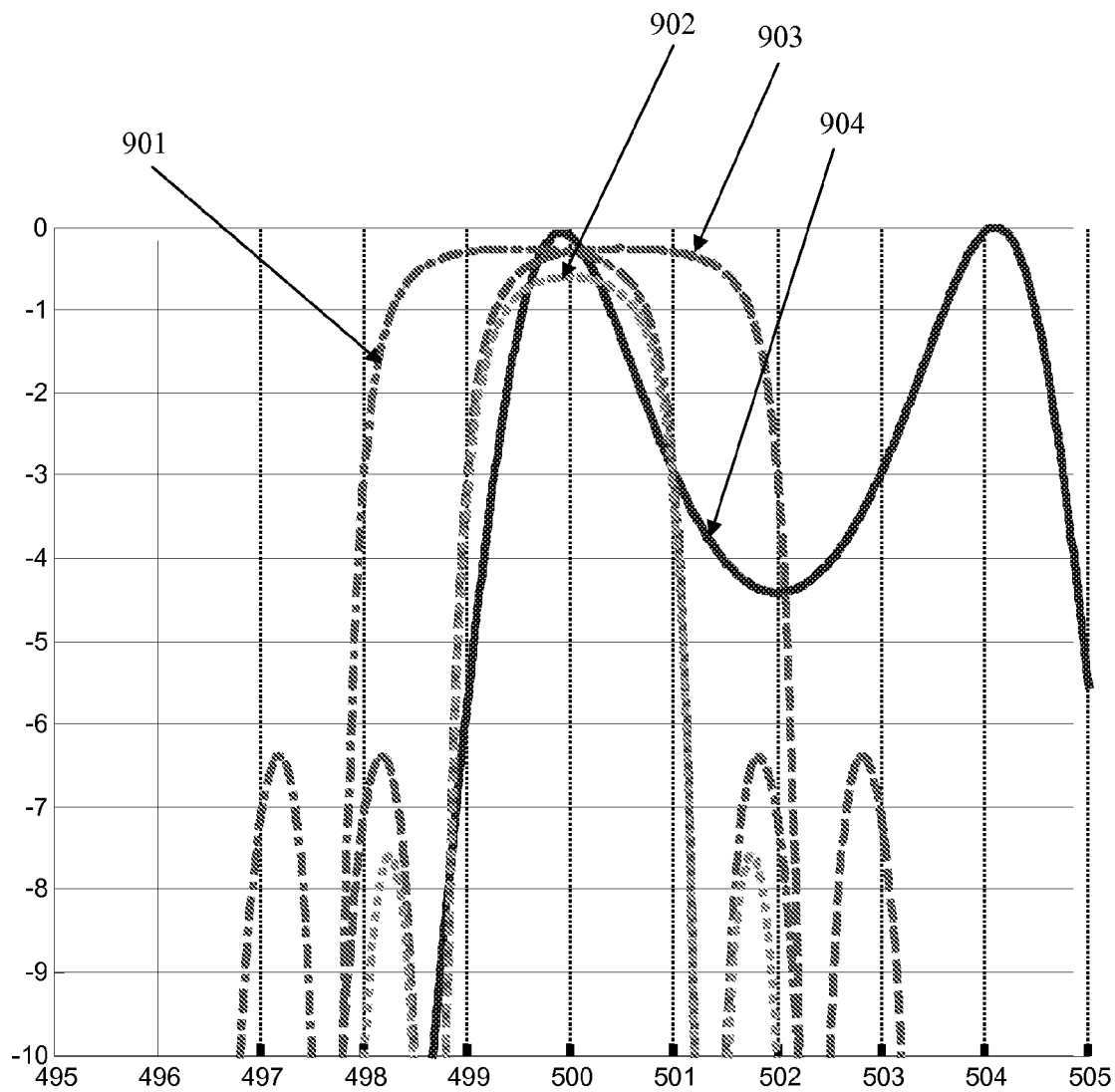
FIG. 9 is a graph of the calculated reflection coefficient showing one reflector shifted up and one reflector shifted down in period and the product of their reflection coefficients in accordance with one aspect of the invention.

The standing wave should then be corrected to adjust for the substrate asymmetry. The standing wave has historically been shifted by adding spacers on either side of the IDT. The present invention in one aspect uses an asymmetric adjustment of the reflector periods, by way of nonlimiting example $P2*P3\sim Po^2$. FIG. 9 illustrates the effect of such structural asymmetry. The Bragg frequency of one reflector 901 is shifted down, the Bragg frequency of the other reflector 903 is shifted up, and the product of their reflection stopbands 902 is shown to offer a reduced bandwidth. It is seen that even a 1.001/0.999 ratio of Bragg frequencies is substantial and begins to lower the overall reflective trapping of energy. The log of the normalized IDT conductance 904 is approximately centered with an IDT period ratio of 0.996*Po. In other words, FIG. 9 is the calculated reflection coefficient of one reflector 903 shifted up in period, the other reflector 901 shifted down in period and the product of their reflection coefficients 902 in accordance with one aspect of the present invention. It is seen that even a 1.001/0.999 spread in the relative periodicity of the reflectors is substantial. The log of the normalized IDT conductance 904 is approximately centered with an IDT period ratio of 0.996.

Figure 10:
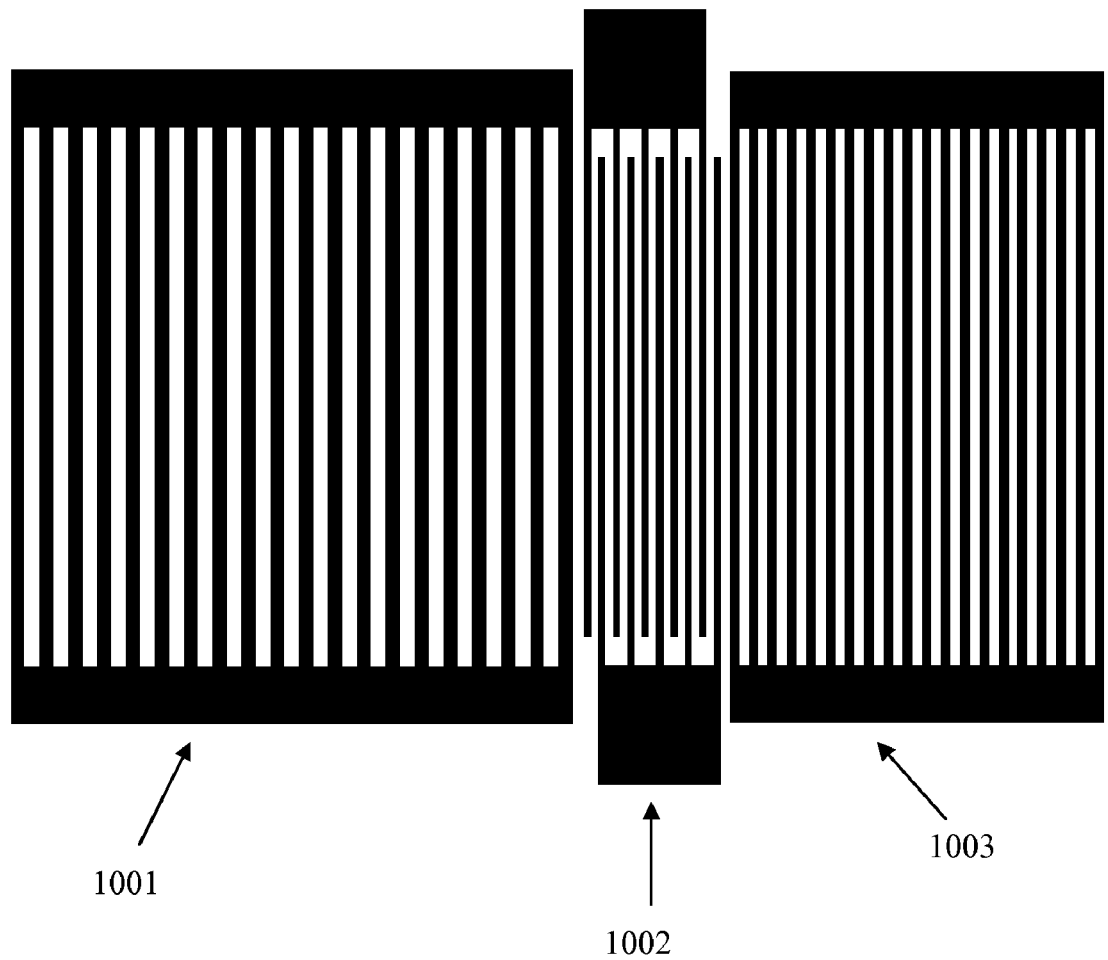
FIG. 10 is an exaggerated diagram of the structure of an embodiment of the invention with unequal reflector periods.

FIG. 10 presents an exaggerated depiction of the final structure in which P2>P3. The specific modeled structure has P1/Po~0.996, P2/Po~1.001, and P3/Po~0.999 (the figure illustrates exaggerated ratios of 0.6 1002, 1.2 1001, and 0.8 1003, respectively, to make the different periods conspicuous. The subsequent figures address specific conditions and illustrate the role of the three variables. The actual reflector lengths are 180 periods and the IDT length is 99.5 periods as opposed to the illustratively convenient short structures. These are merely representative design values.

Figure 11:
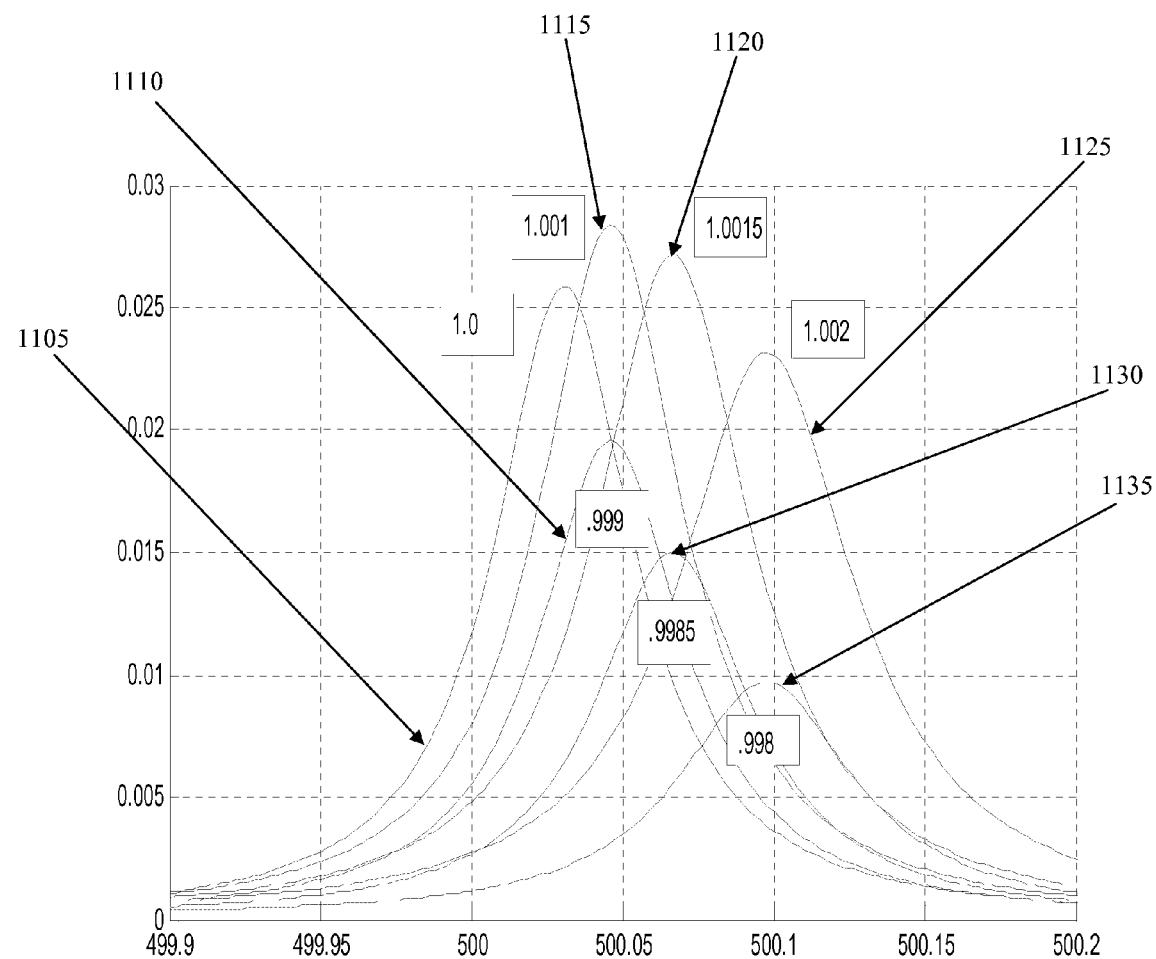
FIG. 11 is a response graph showing the input conductance of a one port resonator example, based on an embodiment of the present invention, for the indicated values of P2/Po.

FIG. 11 shows the simulated input conductances 1105, 1110, 1115, 1120, 1125, 1130, and 1135 of an example of a one port resonator modeled on a completely NSPUDT substrate with P1=0.9957*Po for the indicated values of P2/Po. P3/Po=1−P2/Po is used as an approximation to $P2*P3\sim Po^2$. The invention is functional with other relationships for the values of P2 and P3 and this relationship is merely a convenient, yet functional, design simplification. The lowest frequency resonance corresponds to P2=P3=Po (prior art). It is seen that optimization of the resonance occurs with P2=1.001*Po 1115 and P3=0.999*Po 1120 for this set of design constraints and assumed material properties with a 10% increase in conductance. Clearly other structures and materials will result in other improved ratios. The lower and upper limits on the value of the ratio are limited principally by the constraint that stopbands 901 and 903 of FIG. 9 overlap to result in a nonzero composite value for 902. Based on FIG. 9, reflector spreads in excess of 1.001:0.999 result in decreasing reflector efficiency and could require longer reflectors. One skilled in the art recognizes that $(1+\kappa):(1-\kappa)$ represents a good approximation of the limits of this ratio for reflectivity, $\kappa$.

Due to the asymmetry in reflector periods, the standing waves, as depicted in FIGS. 4A through 4C, would be shifted to the left within the structure of FIG. 10 by decreasing the period of the left reflector while increasing the period of the right reflector and vice versa. This will make the reflection phase of the left transducer increasingly negative, corresponding to an increased phase length, and the reflection coefficient of the right transducer less negative, corresponding to a decreased phase length, and vice versa Structural asymmetry is employed to balance material asymmetry. The tolerance of the structure to the specific selection of IDT period, P1/Po, is also a measure of the sensitivity to reflectivity.

Figure 12:
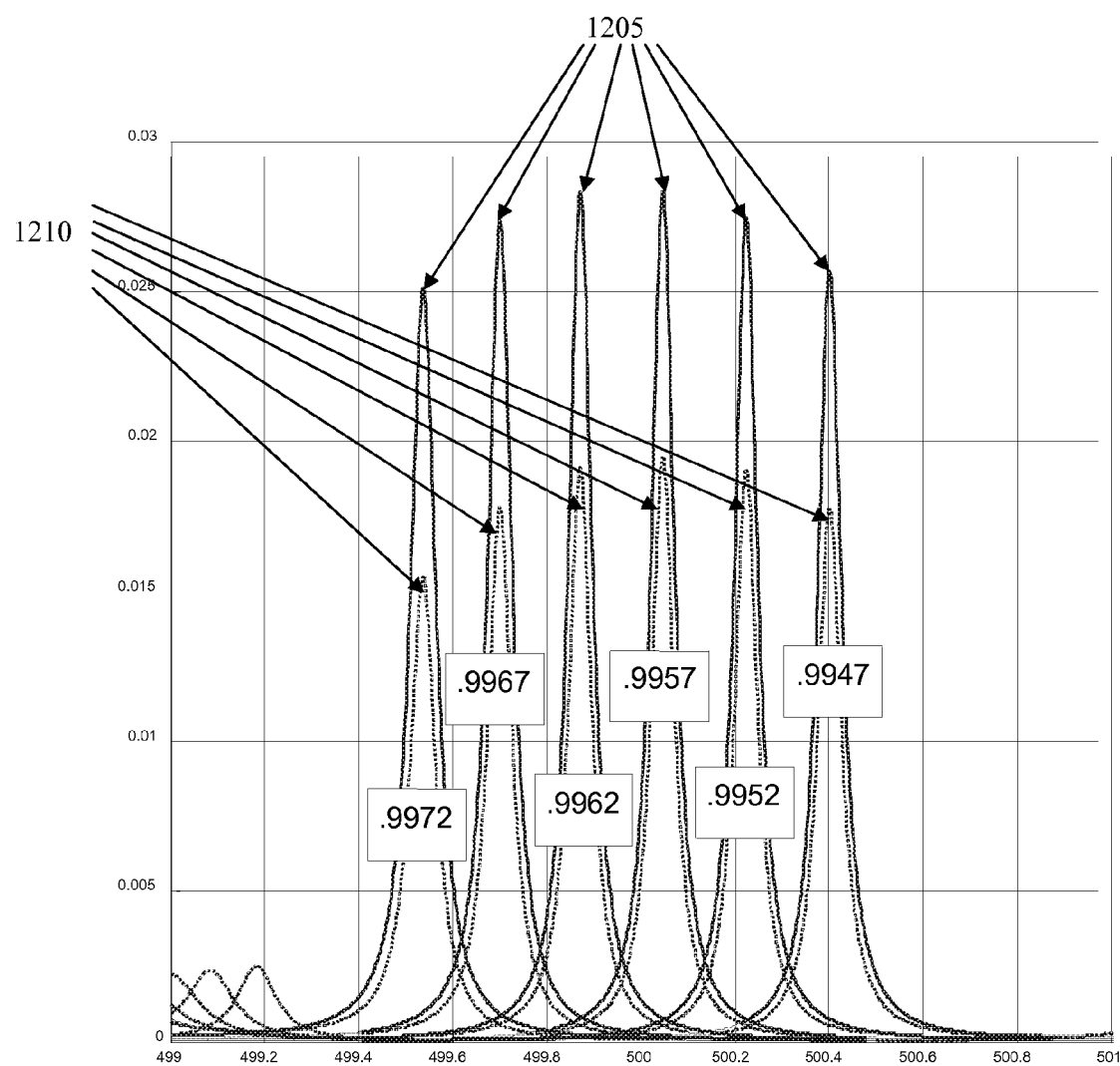
FIG. 12 is a response graph showing the input conductance of a one port resonator example, based on an embodiment of the present invention, for the indicated values of P1/Po.

In FIG. 12, a "typical" one port resonator is modeled on a completely NSPUDT substrate response with P1/Po varied. P2/Po and P3/Po were set to 1.001 and 0.999 in the solid curves 1205 (aligned) and vice versa in the dotted curves 1210 (anti-aligned). The ratio of conductance for the aligned to anti-aligned cases represents a 40% to 60% improvement. More significant than the conductance is the dramatic difference in spurious resonances at lower frequencies.

The resulting structure will have a locally continuous metallization ratio and periodicity, minimizing bulk wave radiation losses, optimizing electrical coupling to the resonance, and minimizing spurious responses. Since the left and right reflector stopbands will be slightly offset, spurious resonances that sometimes occur at the edge of stopband will no longer be reflected by both reflectors.

Figure 13A:
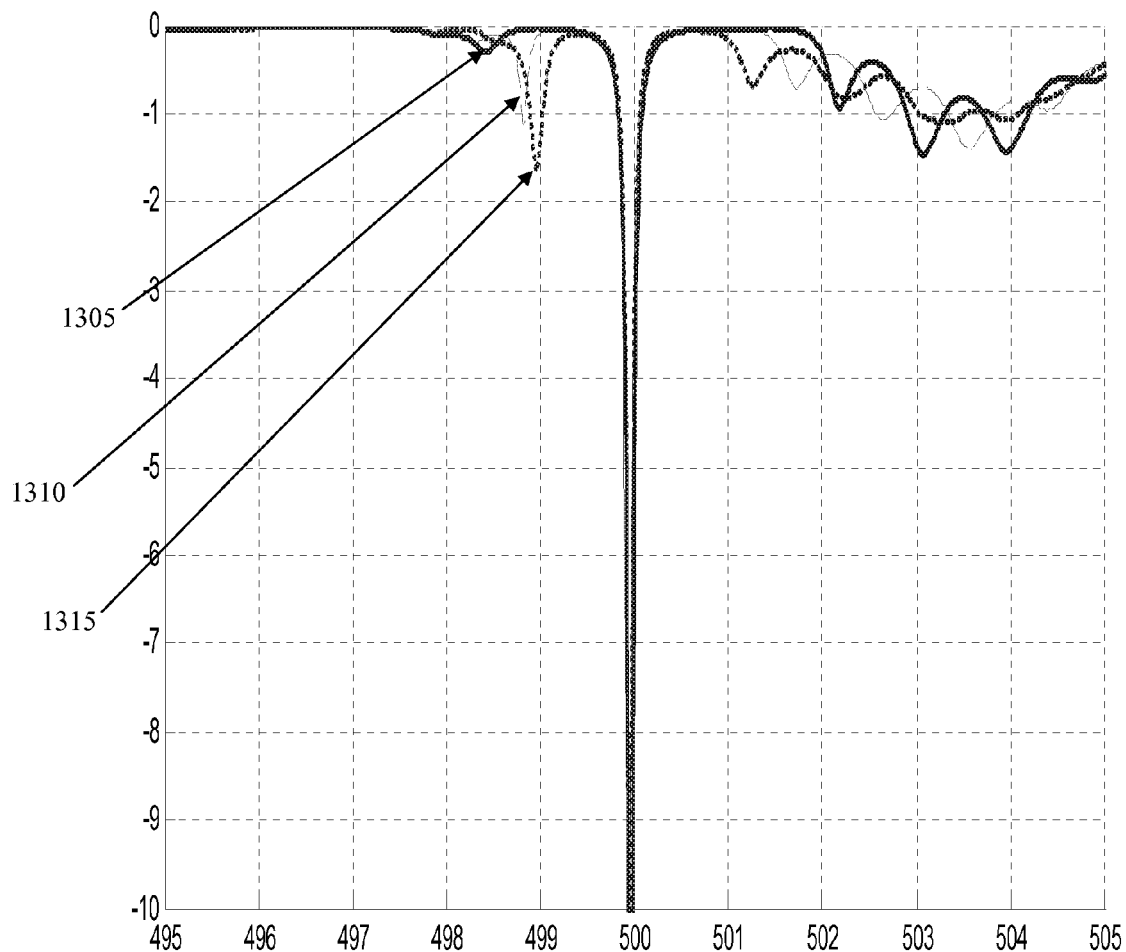
FIG. 13A is a graph showing the simulated response at maximum substrate asymmetry (fully NSPUDT) of the compensated resonator, uncompensated resonator, and mis-compensated resonator cases.
Figure 13B:
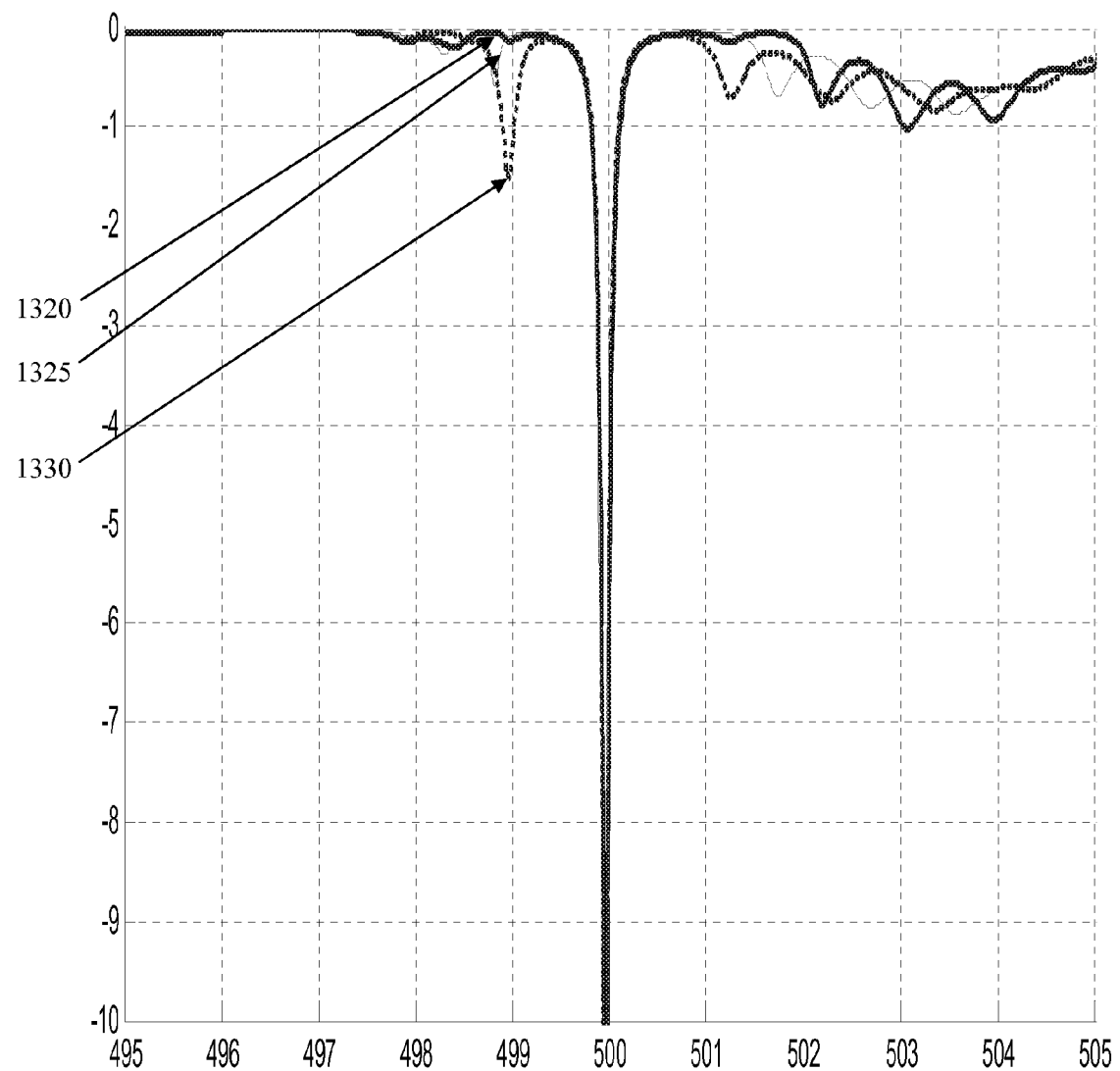
FIG. 13B is a graph showing the simulated responses for the same cases as in FIG. 13A for an NSPUDT angle of 30°.

FIGS. 13A and 13B further evaluate the effect of the proposed compensation on spurious mode performance.

FIG. 13A shows that the simulated response at maximum substrate asymmetry (fully NSPUDT) of the compensated resonator has significantly reduced spurious resonance behavior nearby (dark solid, P2>P3) compared to the uncompensated resonator (light solid, P2=P3) and mis-compensated (dotted, P2<P3) cases. The high frequency peak of conductance offers the same problematic energy absorption for all three cases.

In FIG. 13A the compensated resonator has significantly reduced spurious resonance behavior nearby (dark solid, P2>P3) 1305 compared to the uncompensated resonator (light solid, P2=P3) 1310 and mis-compensated (dotted, P2<P3) 1315 cases. The high frequency peak of conductance offers the same problematic energy absorption for all three cases. In FIG. 13B the same cases are considered for an NSPUDT angle of 30°. Again, the compensated resonator has significantly reduced spurious resonance behavior nearby (dark solid, P2>P3) 1320 compared to the uncompensated resonator (light solid, P2=P3) 1325 and mis-compensated (dotted, P2<P3) 1330 cases. The attributes of the present invention are seen to be evident when considering the ratio of the desired conductance to the spurious mode conductance.

The illustrations thus far have treated the case wherein the "transmission medium" consists of a single IDT. Other cases are also of interest and can benefit from the present invention. In the most general case there may be a plurality of interdigital transducers and semi-reflective elements collectively assembled and considered together as the transmission medium between said outer reflectors. The principles described apply equally well to the more general in-line acoustically coupled resonator structure and to two-port, single-pole resonator structures as they do to the one-port resonator.

Figure 14:
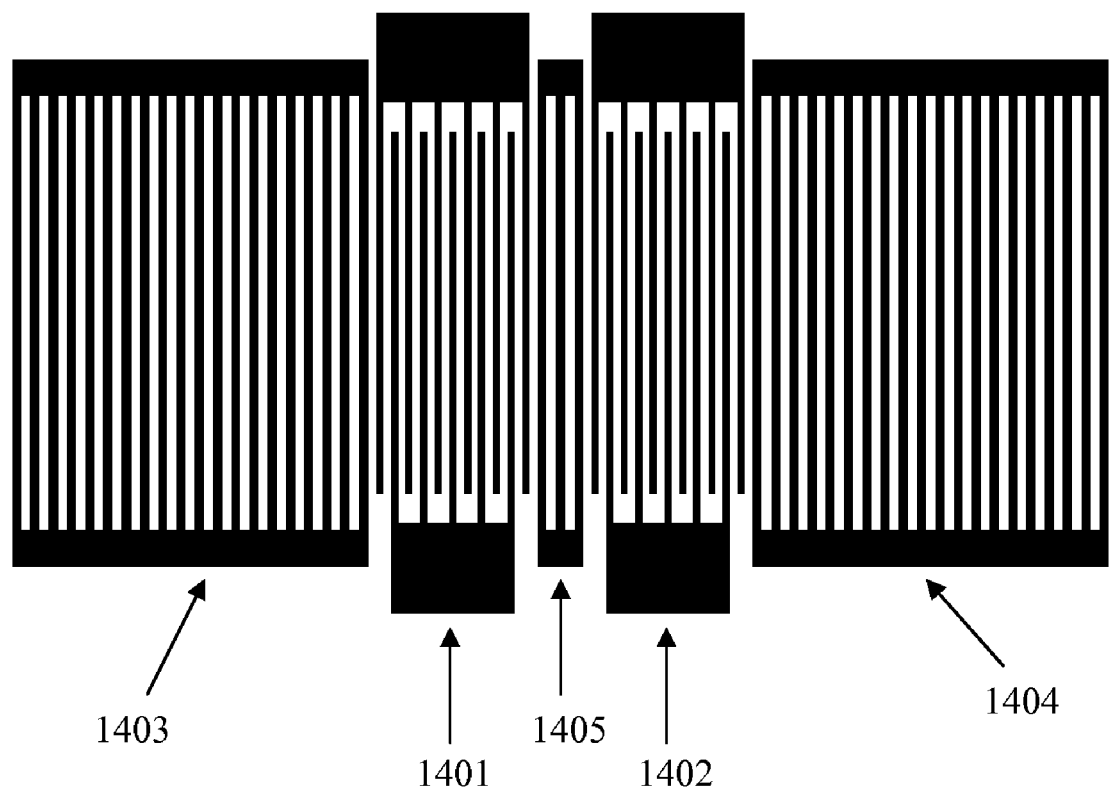
FIG. 14 is a diagram of a two port resonator having IDTs of equal periods, and two reflective element arrays having equal periods.

FIG. 14 shows a generalized prior art resonator in which input IDT 1401, having period P1, and output IDT 1402, having period P2, are located between left reflector array 1403, having period P3, and right reflector array 1404, having period P4. An optional center reflector 1405 is shown, having period P5 that serves to reduce capacitive coupling and optionally to obtain a desired phase shift. In the prior art P1=P2 and P3=P4. Most often, P1=P2=P3=P4. In many cases there also exist phase breaks (not shown). Making P3 not equal to P4 results in the present invention. It is noted that making P1 not equal to P2 offers the potential to reduce spurious modes, especially in a fully NSPUDT substrate wherein the upper conductance peak of one transducer and lower conductance peak of the other transducer are made to overlap, there being little or no transduction overlap outside this narrow band. In the case of a two-port single pole resonator it is typical for P1 through P4 to all be Po and for the center grating to consist of six periods of reflector at a period, P5=5.75/6*Po, resulting in the resonant frequency being at the Bragg frequency of the reflector arrays.

Figure 15:
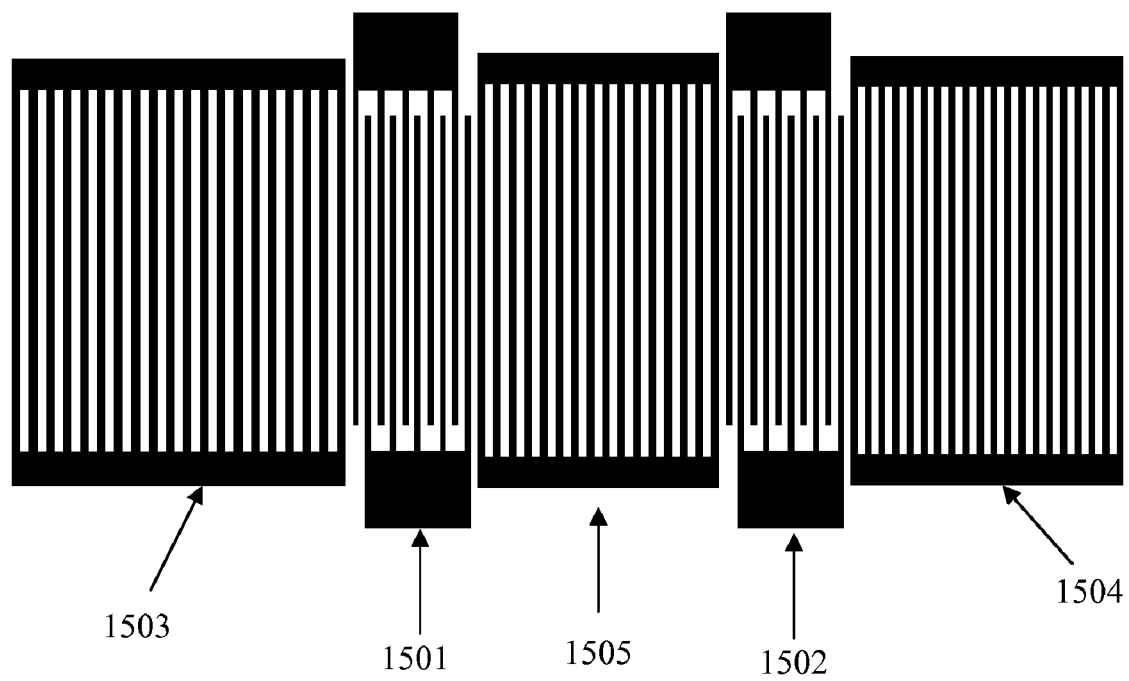
FIG. 15 is a diagram of an embodiment of the invention in which the two reflective element arrays have different periods than each other and the center spacer.

FIG. 15 Illustrates an embodiment of the invention in which a generalized "transmission medium" consists of two transducers 1501 and 1502 and a center grating 1505. One of the outer reflectors 1504 has had its Bragg frequency adjusted upward in frequency 10% and the other reflector 1503 downward in frequency 10%, accomplishing the physical translation of the standing wave at the resonant frequency or frequencies of the structure under both transducers and the center grating simultaneously. Both IDTs 1501 and 1502 are shifted upward 20% and the Bragg frequency of the center grating 1505 is at the nominal frequency or period. Even the 10% and 20% variations in Bragg frequency or period, although one hundred times larger than the demonstrably significant 0.1% changes in period, are difficult to resolve with the eye.

Figure 16:
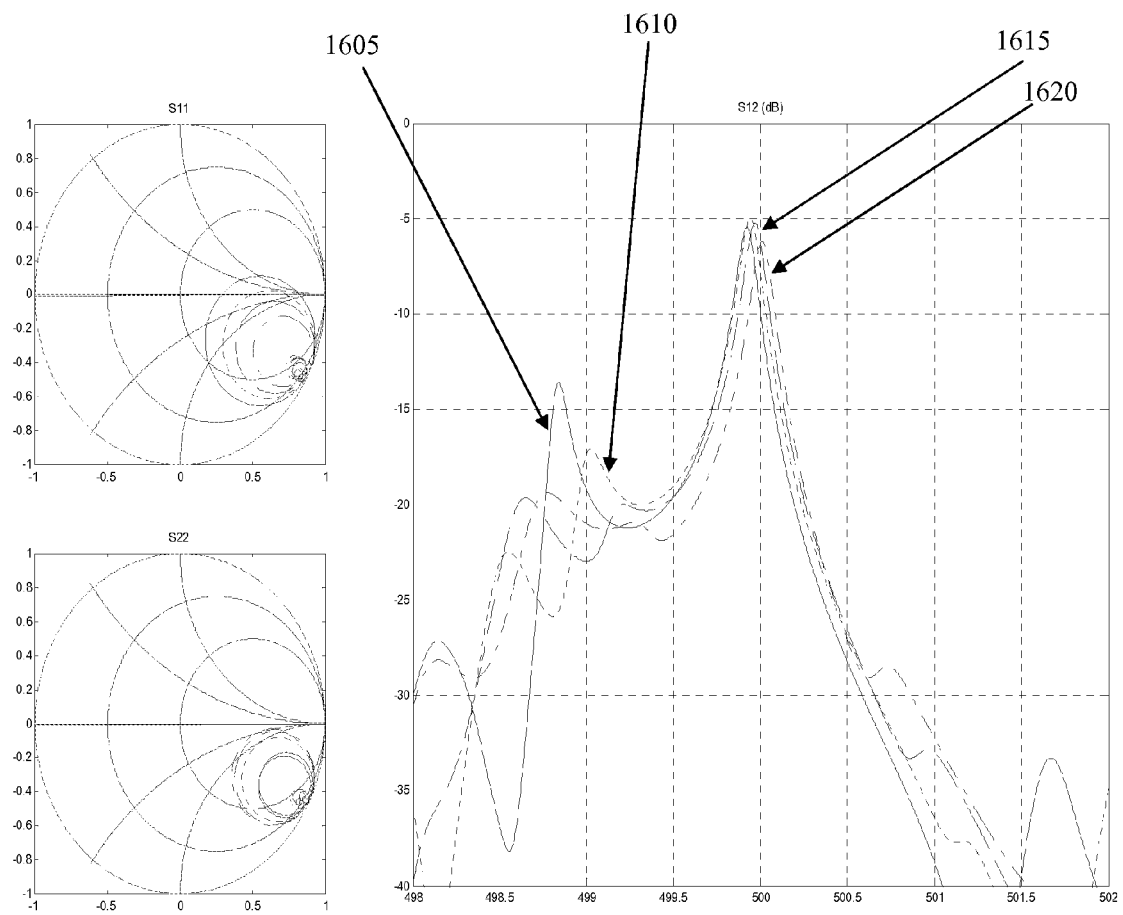
FIG. 16 is a graph of the simulated electrical response of an embodiment of a two port resonator modeled with an asymmetry angle of 30° and no center spacer.

FIG. 16 is a graph of four responses for the simulated electrical response of a two port resonator modeled with an asymmetry angle of 30°, typical of ST quartz with X=18' propagation. The reflector array lengths are 200 periods and the IDT lengths are 49.5 periods at 0.996*Po. There is no center spacer. With P3=P4=Po 1605 (solid line), as in the prior art, there is a significant spurious response at 498.8 MHz and an imbalance of conductance between the input and output IDTs. Using P3=1.001*Po and P4=0.999*Po 1610 (dotted line), as in a possible embodiment of the present invention, reduces the spur and improves the electrical balance between input and output. For another possible embodiment of the present invention, having P3=1.0015*Po and P4=0.9985*Po, the insertion loss begins to increase however and the spur is well controlled 1615 (dashed line). At P3=1.002*Po and P4=0.998*Po (dot-dash line), an undesirable embodiment of the invention, the input conductance is low and insertion loss is increasing significantly. A similar approach can be taken for in-line acoustically coupled resonator filters.

Figure 17:
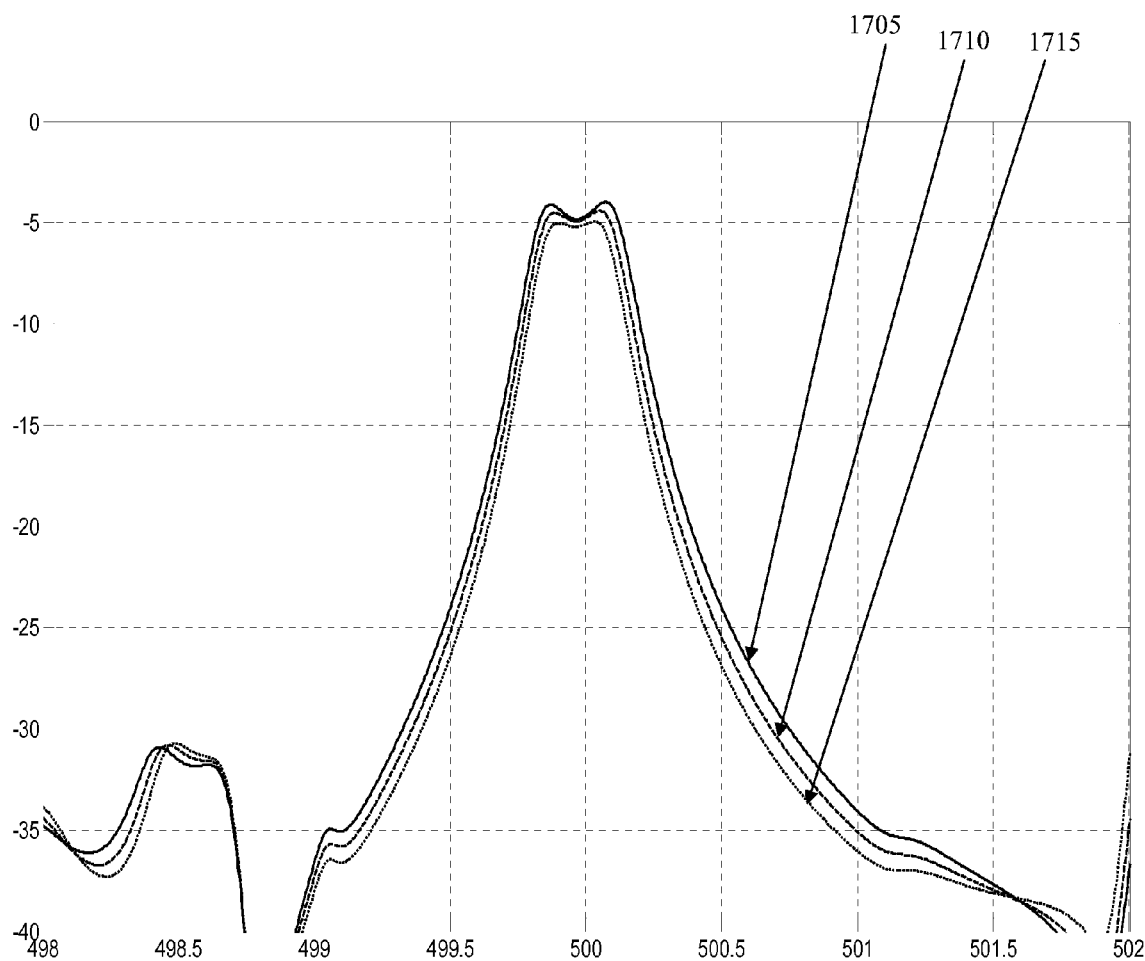
FIG. 17 is a graph of the simulated electrical response of an embodiment of a two port resonator modeled with an asymmetry angle of 30° including a center spacer.

FIG. 17 shows the response when a coupled resonator filter is modeled with a 30° NSPUDT angle. The design parameters include P1=P2=0.996*Po with 99.5 periods in each IDT. The left reflector had 200 periods with P3=1.001*Po and the right grating had 0.999*Po with 200 periods. The center grating had P5=Po with 70 periods 1705 (solid), 80 periods 1710 (dash) and 90 periods 1715 (dotted).

According to one embodiment, the present invention seeks to compensate for a phase shift between reflection and transduction, also known as a phase shift between the mechanical and electrical standing waves, which occurs on orientations of piezoelectric substrates with low symmetry. Such orientations may be required in order to minimize temperature sensitivity or in order to vary the nature of one or more sensor devices in a monolithic array.

Embodiments of the invention do this with no discrete break in the periodic structure. The invention further seeks to align the resonant frequency of the structure with the maximum electromechanical efficiency of the transducer. The invention further seeks to minimize the number of allowed spurious modes though narrowing of the mutual overlap of the reflection bands of the associated reflectors.

Embodiments of the invention allow multiple acoustically coupled resonators to be implemented through iterative application of the principles that are outlined herein. Three specific cases have been discussed that address the vast majority of SGAW resonator requirements. Extension of these examples through transverse acoustic coupling is considered to be an included extension of the invention to higher order coupled resonator filters.

The first case consists of a one port resonator with a single pole (resonant frequency). The second case consists of a two port resonator with distinct input and output transducers having a single resonant frequency. The design principles for these two cases are nearly identical. The third case consists of a two-port, two-pole coupled resonator filter. This case is analogous to a pair of single pole one port resonators sharing a common center grating. While the discussions present a method of arriving at the device and are descriptive of the device, the method does not define the device and similar devices arrived at through different methods should be realized to be the disclosed device.

Since one feature of the invention is a device with improved electrical efficiency, the first step is to select the design parameters of the transducer. Well known coupling of modes (COM) analysis offers a means of predicting the electromechanical behavior of various simple structures and circuit theory is used to combine these device segments. It is well known to one skilled in the art how to implement such models and how to select such parameters as metal thickness, metal ratio, and acoustic aperture to optimize the efficiency and spurious transverse mode rejection of the transducer. It is preferred that the metal thickness, metal to space ratio, and acoustic aperture be maintained constant throughout the structure, leaving the local period of the structure as a defining design variable. Secondary effects such as apodizing the transducer to eliminate unwanted transverse modes and/or $sin(x)/x$ sidelobes and modulating the grating to eliminate reflection sidelobes are well known in the art and are applicable to the methods and devices herein.

The parameter of significant concern, the electrode periodicity, is selected such that the maximum of acoustic conductance of the transducer's electrical port coincides with the desired resonant frequency. In materials of high symmetry having a so-called negative sign of reflectivity, such as ST-quartz, the peak is located at the lower edge of the transducer's response. In materials of high symmetry having a so-called positive sign of reflectivity, such as 128° lithium niobate, the peak is located at the upper edge of the transducer's response. In materials of general symmetry, there will be peaks at both edges and for so-called natural single phase unidirectional transducer (NSPUDT) orientations having a $\pi/4$ phase difference between mechanical and electrical standing waves, the two peaks are nearly equal in strength.

Since the scattering of energy into bulk acoustic waves is more significant at the upper edge of the transducer response, the peak at the lower edge should be chosen whenever possible; however if the upper peak is significantly dominant it may be necessary to avoid bulk wave interference through thicker metal or other energy trapping means known in the literature.

The significant drawback of all resonators based on the peak of transduction is that the resonant frequency becomes a function of the strength of reflectivity as well as the velocity of the wave itself. This complicates the design process and places more stringent demands on manufacturing; however the result is an increased performance of the device.

It is possible to vary the periodicity of the transducer from its average value in some fashion and the period determined in the first step is merely the period of an equivalent uniform transducer. One such reason to modulate the period of the transducer is to reduce the $sin(x)/x$ sidelobes of the uniform transducer. Another is to introduce continuity in the value of the local periodicity between the IDT and the reflector to further reduce bulk wave scattering.

The next step in the design process is to select an initial periodicity for the left and right gratings. An initial value for this period is chosen such that the so-called Bragg frequency of the gratings corresponds to the desired resonant frequency. This provides a maximum symmetric range in which to alter the grating periods while still keeping the resonant frequency within the stopbands of all of the segments of the resonator. Obviously other initial values can be selected; however since the process will be iterative, application of the principles to a complete optimization for an assumed set of criteria will result in the same outcome regardless of the specific initial conditions.

The value of the average grating periods and/or IDT period requires further fine adjustment to satisfy the phase conditions for resonance (frequency trimming). Typically the reflectors will have $\pi/2$ phase of reflection at the Bragg frequency. The required value will depend on the phase of the transmission through the transducer and the result is unaltered only if the transmission phase is $\pi/2$ at $F_R$. COM analysis or the like is used to adjust the reflector average period.

Again, the reflectors may be tapered, modulated, allowed to vary from their local period and the like in order to obtain desirable second order benefits such as reduced sidelobes and a further reduction of spurious modes.

The steps to this point yield a resonator that is analogous to Uno U.S. Pat. No. 4,387,355 but do not account for substrate asymmetry and do not further limit spurious responses, other than to the extent that modulating the transducer and reflectors might accomplish such.

The next step is to separate the periodicities of the left and right reflectors. Doing so will reduce the phase shift in one reflector and increase the phase shift in the other. The amount by which the reflection phase shifts are changed should be approximately equal and opposite, maintaining the proper phase condition through the structure but shifting the peaks of the standing wave to one direction or the other. In reality, nonlinearities of the phase vs. frequency will result in slightly different shifts in order to obtain optimization and frequency trimming. The amount that the standing wave should be shifted and the direction to which it should be shifted are determined by the degree and direction of substrate asymmetry.

Shifting the position of the standing waves accomplishes the correct placement of the transducer with respect to the standing wave and optimizes the electrical efficiency of the resonator. Accomplishing this shift through introducing a periodicity ratio between the two reflectors causes the reflection bands and sidelobes of the two reflectors to no longer completely overlap. This reduces the number of spurious signals since one reflector or the other is likely to leak the undesired energy. Improved spurious performance is a side benefit of the correction for substrate asymmetry.

The preceding paragraphs describe a device having independent average acoustic periods in a left reflector, a center transducer, and a right reflector and having a peak of electrical efficiency at the resonant frequency and an alignment of the transducer's location with the electrical standing wave of the trapped energy. The device described and the method of obtaining it compensate for a phase shift between reflection and transduction, also known as a phase shift between the mechanical and electrical standing waves by introducing an offsetting asymmetry in the reflection phases of the two reflectors and a corresponding lateral shift of the standing waves.

Such asymmetry occurs for a number of desirable substrates and is particularly troublesome on ST quartz with X+18° propagating. This orientation is frequently used in tandem with ST-X quartz as a temperature probe in sensor arrays. In particular, ST X+18° is used in a 3-sensor array along with ST-X in the tire pressure monitoring system of Transense, U.S. Pat. No. 6,865,950 to Freakes. The conditions would persist in slight modifications of the substrate selection for this application to cuts ranging from ST (42.75° RYC) to Y-cut where an off-axis temperature probe is included in an array. Substrate asymmetry also occurs in the off-axis temperature stable cut of Cho and Williams at about 34° RYC quartz with 43° propagation or in modifications thereof as suggested in G.B. Pat. No. 2,381,069 to Kalinin to Transense.

Similar situations will occur in doubly rotated cuts of emerging piezoelectric materials such as lanthanum gallium silicate (LGS), tantalate (LGT), and niobate (LGN) and their calcium/strontium tantalum/niobium analogs, CNGS, CTGS, SNGS, and STGS as might be selected to optimize stability for frequency control applications or sensitivity to specific physical effects.

While lithium niobate and lithium tantalate are primarily used on high symmetry orientations, the increasing use of high velocity leaky SAW modes may lead to applications of the technology herein to these materials as well.

The disclosed device and method accomplish this shift with no discrete break in the periodic structure and further minimize the number of allowed spurious modes though narrowing of the mutual overlap of the reflection bands of the associated reflectors. This results in a resonator that is more desirable for multi-sensor wireless arrays. In particular, the spurious modes of one of the parallel-connected resonators may overlap the desired response of another.

The illustrated case of a one-port resonator is readily extended to two-port single pole resonator by merely breaking the central transducer into two independent transducers. While there is no prohibition from the transducers having slightly different periods, there is no requirement for them to do so. One advantage to doing so is illustrated by the significantly equal conductance peaks at upper and lower edges of the IDT response when the NSPUDT angle is near 45°. In this case it may be desirable to align one transducer at the upper peak and the other at the lower peak. The improved filtering performance should be weighed against the increased manufacturing variability.

The same average periodicity discussed above is desired and the same second order benefits may be obtained. Additionally, a short, grounded, electrically-inactive segment can be located between the two transducers with a period essentially equal to the average period and a length sufficient only to reduce capacitive coupling between the transducers. Note that the total length of the transducers will now be determined by different design rules (a transmission insertion loss specification) than in the one port (a crystal resistance specification); however, this difference is not germane to the invention. These lengths are determined in the same general manner as in any other prior art resonator in order to balance electrical loading, acoustic energy losses, bandwidths and device size.

By further extension, a structure may be created wherein two one port resonators are conceptually joined end to end. In principal, this would be conceptually performed prior to introducing the periodicity differential between the left and right reflectors. The central reflector will not be twice the length of the original reflectors but rather will typically be slightly shorter than either of the original reflectors so as to allow signal coupling from one resonator to the other.

In order to introduce the correct translation of the coupled standing waves in both transducers, it is desirable to leave the center reflector at the initial periodicity and to adjust the outer reflectors for the entire phase shift. There is no requirement to do so; however there are advantages to leaving the central reflector period unmodified.

While the simplest case maintains both transducers at the same periodicity and length and leaves the center reflector at the average reflector periodicity, these are merely conveniences of presentation and the invention includes other perturbations that obey the spirit of the preceding device description and method so as to accomplish the required translation of the standing wave peaks to align with the transducer position and to align the maxima of transducer efficiency with the desired resonant frequencies.

It should be especially noted that displacement of the transduction centers from the reflections centers of an IDT due to substrate asymmetry has been explicitly stated. There may also be reasons for which an asymmetric transducer structure might be used on a symmetric substrate. Such a situation would give rise to the same problems addressed herein and the same solution is offered. The specification should be construed to include such cases.

While the discussions and methods have focused on one embodiment of the invention, namely changing the periods of the outer reflectors to alter their Bragg Frequency and therefore to alter the reflection phase, there exist other means that are equally suitable as embodiments. In particular, any combination of changes in period and velocity may be employed where a change in period has been heretofore discussed. Therefore addition of dielectric layers, variations in metal thickness, groove depth, linewidths or electrical interconnections of the reflective elements may be used. Furthermore the variation of one or more substrate layer thicknesses in layered, dispersive structures may be modulated. Dopants may be added to one or more substrate layers or to the metal and local oxidization, nitriding, carbidization or the like may be used to alter the velocity and thus the Bragg Frequency. Physical effects such electrical bias using the electro-acoustic effect and the like may also be employed. These means are all considered within the term changing the Bragg Frequency, as used in the claims below.

While the examples given addressed uniform gratings and transducers, the plurality of unit cells need not be a periodic array of identical cells and the transducers need not be uniform or to have a uniform phase shift or displacement between the centers of transduction and centers of reflection. A unit cell in its simplest case could be formed by a pair of electrodes exhibiting piezoelectric coupling. In the case on non-uniform transducers and reflectors, the average values and average deviations are considered. The perturbations of the Bragg Frequency of the reflector represent an electrical property change that may be a functional average of a spatially varying structure and the perturbations used to correct it need not be constant perturbations through the dimensions of the grating. Spatial variations may be inherent to the method of implementation such as a Gaussian distribution of chemical alteration or be intentionally introduced.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An acoustic wave device comprising:
a substrate comprising at least a piezoelectric layer;
a first reflector disposed on said substrate, having a first reflector Bragg frequency;
a second reflector disposed on said substrate, having a second reflector Bragg frequency; and
at least one transducer disposed between said first and second reflectors wherein said at least one transducer has a plurality of repeating cells, each cell having a center of transduction and a center of reflection, at least one of said cells having an asymmetry between its center of transduction and its center of reflection, said first reflector Bragg frequency and said second reflector Bragg frequency being unequal and providing an adjustment of a standing wave into alignment with said repeating cells' centers of transduction.

2. The acoustic wave device according to claim 1, wherein said substrate induces an asymmetry between said centers of transduction and reflection.

3. The acoustic wave device according to claim 1, wherein said adjustment reduces root mean square (RMS) error of the phase mismatch between centers of transduction and the peaks of the electrical potential of the standing wave.

4. The acoustic wave device according to claim 1, wherein said adjustment reduces the electrical coupling to spurious modes.

5. The acoustic wave device according to claim 1, wherein said adjustment reduces insertion loss.

6. The acoustic wave device according to claim 1, wherein at least one of said reflectors comprises dots.

7. The acoustic wave device according to claim 1, wherein at least one of said reflectors comprises strips.

8. The acoustic wave device according to claim 1, wherein at least one of said reflectors comprises edges.

9. The acoustic wave device according to claim 1, wherein at least one of said reflectors comprises grooves.

10. The acoustic wave device according to claim 1, wherein at least one of said reflectors comprises implanted dopants.

11. The acoustic wave device according to claim 1, wherein said at least one transducer comprises a first transducer and a second transducer.

12. The acoustic wave device according to claim 1, wherein said at least one transducer comprises:
a first transducer;
a second transducer; and
an electrically inactive segment disposed between said first transducer and said second transducer.

13. The acoustic wave device according to claim 1, wherein said substrate includes a piezoelectric layer selected from the group consisting of zinc oxide, aluminum nitride, gallium nitride, quartz; gallium phosphate; aluminum phosphate; lanthanum gallium silicate (LGS); lanthanum gallium tantalate (LGT); lanthanum gallium niobate (LGN); calcium niobium gallium silicate (CNGS); calcium tantalum gallium silicate (CTGS); strontium niobium gallium silicate (SNGS); strontium tantalum gallium silicate (STGS), lithium niobate, lithium tantalate and combinations thereof.

14. An acoustic wave device comprising:
an asymmetric substrate comprising at least a piezoelectric layer;
a first reflector disposed on said asymmetric substrate, having a first reflector Bragg frequency;
a second reflector disposed on said asymmetric substrate, having a second reflector Bragg frequency; and
at least one transducer disposed between said first and second reflectors wherein said at least one transducer has a plurality of repeating cells, each cell having a center of transduction and a center of reflection, at least one of said cells having an asymmetry between its center of transduction and its center of reflection, said first reflector Bragg frequency and said second reflector Bragg frequency being unequal and providing an adjustment of a standing wave into alignment with said repeating cells' centers of transduction.

15. The acoustic wave device according to claim 14, wherein said at least one transducer comprises a first transducer and a second transducer.

16. The acoustic wave device according to claim 14, wherein said at least one transducer comprises:
a first transducer;
a second transducer; and
an electrically inactive segment disposed between said first transducer and said second transducer.

17. The acoustic wave device according to claim 14, wherein said adjustment reduces the electrical coupling to spurious modes.

18. The acoustic wave device according to claim 14, wherein said adjustment reduces insertion loss.

19. The acoustic wave device according to claim 14, wherein at least one of said reflectors comprises strips.

20. An acoustic wave device comprising:
an asymmetric substrate comprising at least a piezoelectric layer;
a transducer disposed on said asymmetric substrate;
a first reflector comprised of strips, disposed on said asymmetric substrate proximate said first transducer, having a first reflector Bragg frequency;
a second reflector comprised of strips, disposed on said asymmetric substrate proximate side of said second transducer opposite said first reflector, having a second reflector Bragg frequency; and
wherein said transducer has a plurality of repeating cells, each cell having a center of transduction and a center of reflection, at least one of said cells having an asymmetry between its center of transduction and its center of reflection, said first reflector Bragg frequency and said second reflector Bragg frequency being unequal and providing an adjustment of a standing wave into alignment with said repeating cells' centers of transduction, wherein said adjustment reduces the electrical coupling to spurious modes.

* * * * *